(12) United States Patent
Hung et al.

(10) Patent No.: US 11,973,075 B2
(45) Date of Patent: Apr. 30, 2024

(54) DUAL SUBSTRATE SIDE ESD DIODE FOR HIGH SPEED CIRCUIT

(71) Applicant: Taiwan Semiconductor Manufacturing Co., Ltd., Hsin-Chu (TW)

(72) Inventors: Tao Yi Hung, Hsin-Chu (TW); Yu-Xuan Huang, Hsinchu (TW); Kuo-Ji Chen, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/181,196

(22) Filed: Feb. 22, 2021

(65) Prior Publication Data
US 2022/0271026 A1    Aug. 25, 2022

(51) Int. Cl.
*H01L 27/02* (2006.01)
*H01L 23/528* (2006.01)

(52) U.S. Cl.
CPC ...... *H01L 27/0255* (2013.01); *H01L 23/5286* (2013.01); *H01L 27/0292* (2013.01)

(58) Field of Classification Search
CPC ............. H01L 27/0255; H01L 27/0292; H01L 23/5286
See application file for complete search history.

(56) References Cited

U.S. PATENT DOCUMENTS

| | | | |
|---|---|---|---|
| 5,898,193 A * | 4/1999 | Ham | H01L 27/0255 257/355 |
| 6,515,330 B1 | 2/2003 | Hurtz et al. | |
| 8,143,690 B2 * | 3/2012 | Park | H01L 27/0814 257/E27.024 |
| 10,170,589 B2 | 1/2019 | Su et al. | |
| 2002/0121647 A1 | 9/2002 | Taylor | |
| 2005/0156186 A1 * | 7/2005 | Lin | H01L 25/0753 257/E25.032 |
| 2007/0120258 A1 * | 5/2007 | Hayashi | H01L 23/49811 257/E23.153 |
| 2009/0045457 A1 | 2/2009 | Bobde | |
| 2010/0244090 A1 * | 9/2010 | Bobde | H01L 27/0817 257/E29.335 |
| 2012/0248582 A1 | 10/2012 | Gu et al. | |
| 2013/0009253 A1 * | 1/2013 | Wang | H01L 27/0629 438/237 |

(Continued)

FOREIGN PATENT DOCUMENTS

JP      H0258372      *  2/1990

*Primary Examiner* — Sheng-Bai Zhu
(74) *Attorney, Agent, or Firm* — Eschweiler & Potashnik, LLC

(57) ABSTRACT

An ESD protection device includes a PN diode formed in a semiconductor body. The PN diode has a first contact coupled to a metal structure on a front side of the semiconductor body and a second contact coupled to a metal structure on a back side of the semiconductor body. The metal coupled to the first contact is spaced apart from the metal coupled to the second contact by a thickness of the semiconductor body. This spacing greatly reduces the capacitance associated with the metal structures, which can substantially reduce the overall capacitance added to an I/O channel by the ESD protection device and thereby improve the performance of a high-speed circuit that uses the I/O channel.

20 Claims, 14 Drawing Sheets

(56) References Cited

U.S. PATENT DOCUMENTS

| | | |
|---|---|---|
| 2014/0268444 A1* | 9/2014 | Bertin ................ H01L 27/0266 977/938 |
| 2014/0327105 A1 | 11/2014 | Ramachandran et al. |
| 2016/0126220 A1 | 5/2016 | Chen et al. |
| 2017/0186799 A1 | 6/2017 | Lin et al. |
| 2019/0056348 A1 | 2/2019 | Liu et al. |
| 2019/0081041 A1 | 3/2019 | Thei et al. |
| 2019/0131287 A1 | 5/2019 | Huang et al. |
| 2019/0164882 A1 | 5/2019 | Chen et al. |
| 2019/0363063 A1 | 11/2019 | May et al. |
| 2019/0393130 A1 | 12/2019 | Mahnkopf et al. |
| 2020/0035558 A1 | 1/2020 | Ching et al. |
| 2020/0105761 A1 | 4/2020 | Liaw |
| 2020/0312994 A1 | 10/2020 | You et al. |
| 2020/0373236 A1 | 11/2020 | Dogan et al. |

* cited by examiner

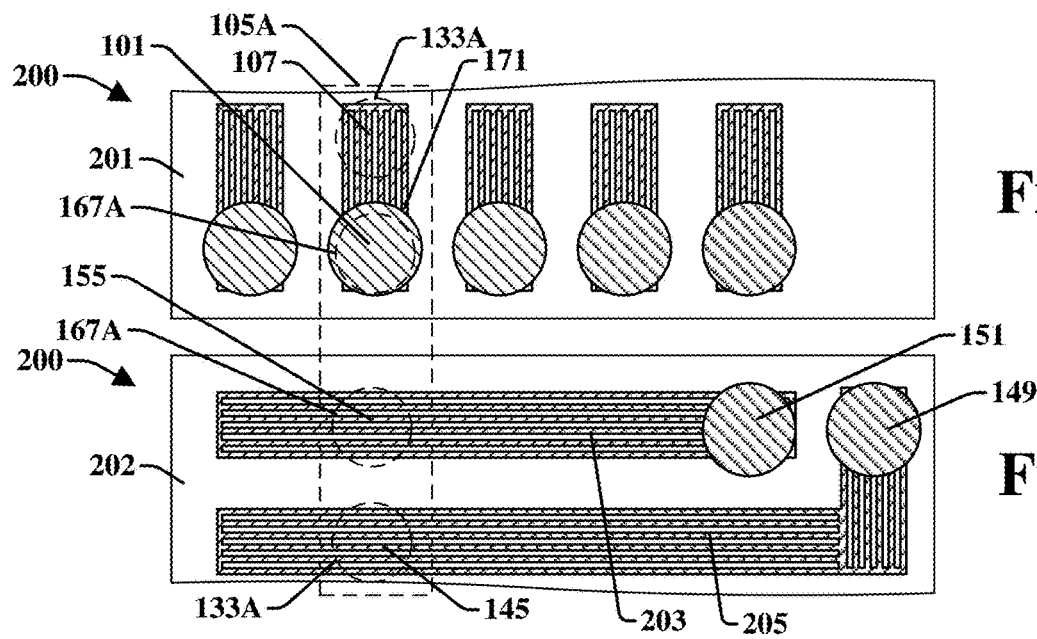
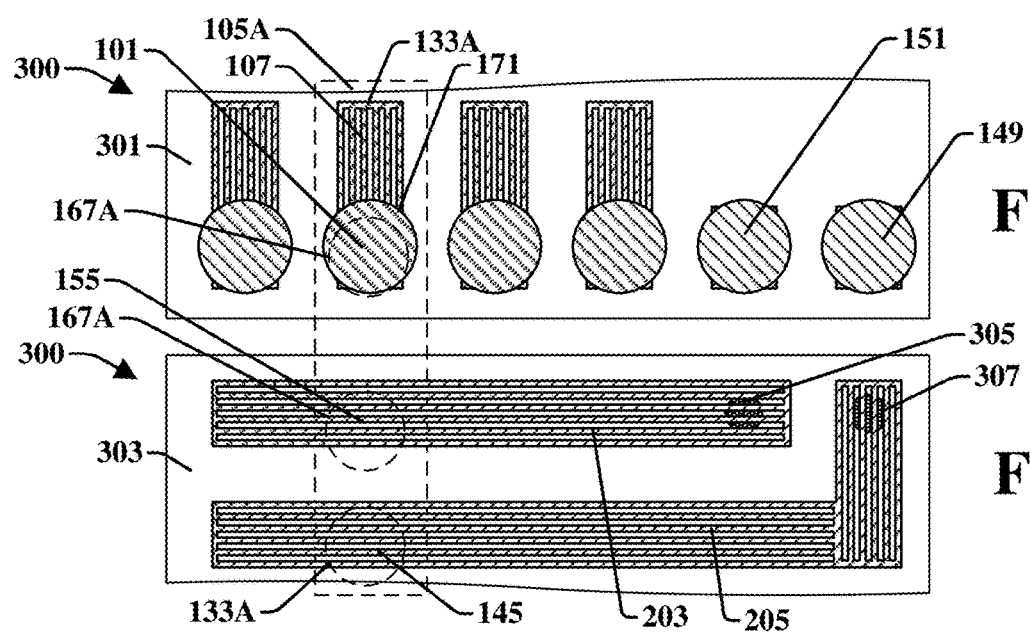

DUAL SUBSTRATE SIDE ESD DIODE FOR HIGH SPEED CIRCUIT

BACKGROUND

As integrated circuit density increases, the spacing between structures becomes smaller. Smaller spacing lead to higher capacitance. If capacitance is too high in relation to a desired speed of operation, performance may be reduced. Accordingly, there has been a long felt need for low capacitance device structures that can be used in high speed circuits.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A illustrates an edge portion of a front side of an integrated circuit device that includes an ESD protection device according to some aspects of the present teachings FIGS. 2B illustrates a back side of the integrated circuit device of FIG. 2A.

FIGS. 3A illustrates an edge portion of a front side of another integrated circuit device that includes an ESD protection device according to some aspects of the present teachings FIGS. 3B illustrates a back side of the integrated circuit device of FIG. 3A.

DETAILED DESCRIPTION

Figure 1:
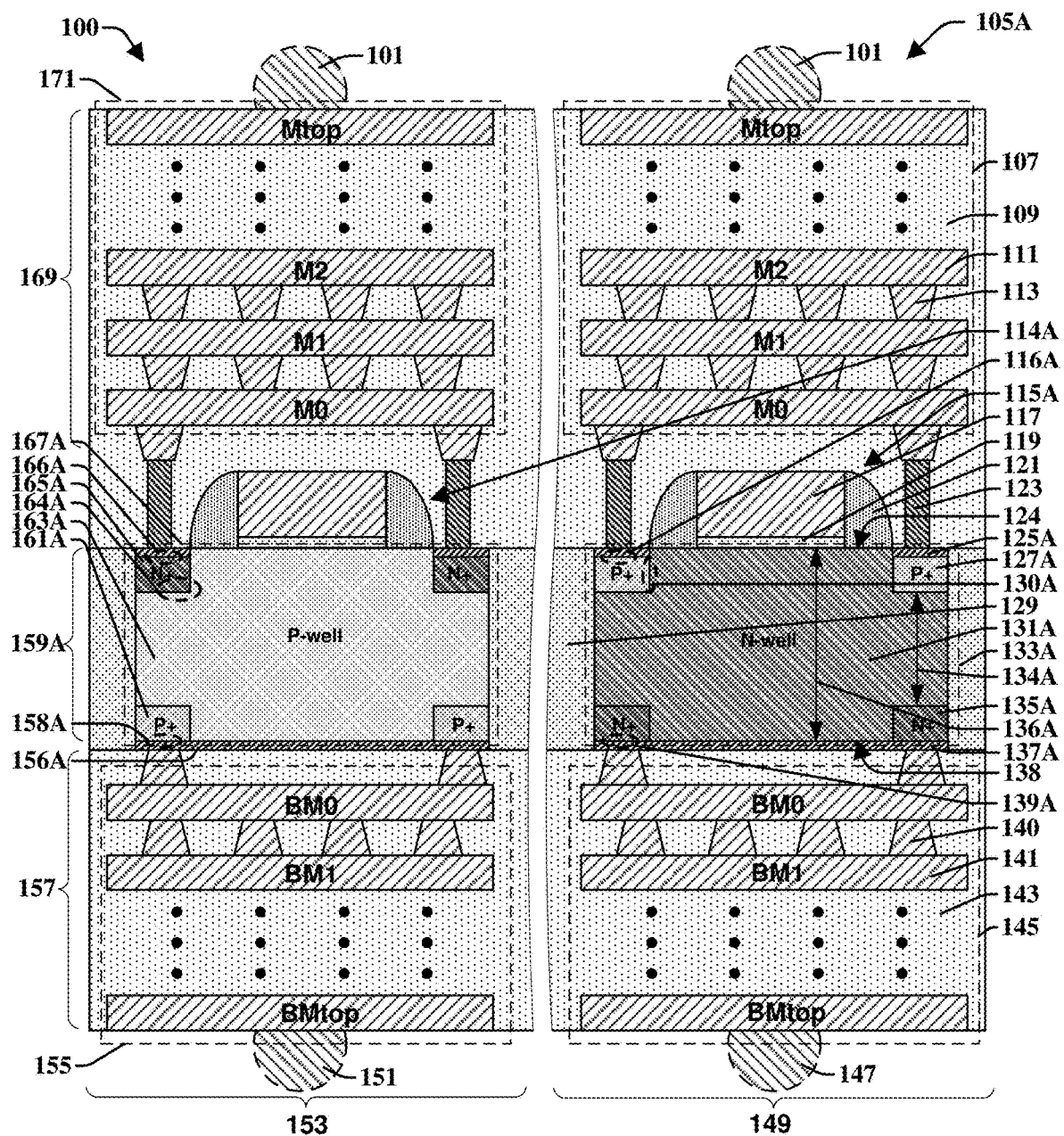
FIG. 1 provides a cross-sectional view illustrating an ESD protection device in an integrated circuit device according to some aspects of the present teachings.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

The present disclosure teaches methods and device structures for improving the performance of a high-speed circuit having an I/O channel with ESD protection. In accordance with some aspects of the present teachings, the ESD protection device includes a PN diode formed in a semiconductor body. The PN diode has a first contact coupled to a metal structure on a front side of the semiconductor body and a second contact coupled to a metal structure on a back side of the semiconductor body. The metal coupled to the first contact is spaced apart from the metal coupled to the second contact by a thickness of the semiconductor body. This spacing greatly reduces the capacitance associated with the metal structures, which in turn has been found to substantially reduce the overall capacitance associated with the I/O channel and thereby improve the performance of the high-speed circuit.

The diode may be a P+/N-well diode, and N+/P-well diode, an N-well/P-well diode, or one having any other type of junction. In some embodiments, the diode has a shallow trench isolation (STI) diode structure in that it includes two heavily doped regions separated by an STI structure on the front side of the semiconductor body. In contrast to a conventional STI diode, the two heavily doped regions may have a same doping type. In some embodiments, the diode has a gate-aligned diode structure including two heavily doped regions that are adjacent the front side and have edges aligned to opposite sides of a gate structure disposed on the front side. In various embodiments, the two heavily doped regions adjacent the front side have a same doping type or opposite doping types. In some embodiments, the gate-aligned diode further includes two heavily doped regions adjacent the back side of the semiconductor body having edges aligned to opposite sides of the gate structure disposed on the front side. In some embodiments, the gate structure is a polysilicon or metal transistor gate structure. In some embodiments, the gate structure is a finFET (fin field effect transistor) gate. In some embodiments, the gate structure includes nanosheets or nanowires. A diode according to the present teachings may thus be formed using many of the same process steps otherwise used in the formation of an integrated circuit device.

Some aspects of the present teachings relate to an ESD protection device having a first PN diode coupled between an I/O channel and a $V_{DD}$ rail (a pull-up diode) and a second PN diode coupled between the I/O channel and a $V_{SS}$ rail (a pull-down diode). The $V_{DD}$ rail and the $V_{SS}$ rail are power rails for a circuit, which may be a high-speed circuit. An N-terminal of the pull-up diode is coupled to the $V_{DD}$ rail. A P-terminal of the pull-down diode is coupled to the $V_{SS}$ rail. A P-terminal of the pull-up diode and an N-terminal of the pull-down diode are each coupled to the I/O channel. This structure clamps the I/O channel at just over the $V_{DD}$ rail voltage and just under the $V_{SS}$ rail voltage. In accordance with the present teachings, each of the first pull-down diode and the pull-up diode has contacts on opposite sides of the semiconductor body coupled to metal structures on opposite sides of the semiconductor body.

In some embodiments, the pullup diode is a P+/N-well diode. This structure may facilitate isolation in devices having N-wells coupled to $V_{DD}$. In some embodiments, the pull-down diode is an N+/P-well diode. This structure may facilitate isolation in devices having a P-substrate coupled to $V_{SS}$.

Some aspects of the present teachings relate to a method of manufacturing an integrated circuit device having a diode according to the present disclosure. The method includes forming a PN junction diode in a semiconductor substrate, forming a first metal interconnect on the front side of the semiconductor substrate with a coupling to one side of the PN junction diode, and forming a second metal interconnect on the side of the semiconductor substrate with a coupling to to a second side of the PN junction diode. In some embodiments, the semiconductor substrate is thinned before forming the second metal interconnect. In some embodiments, all the doping of the semiconductor substrate is completed before forming the first or second metal interconnect.

FIG. 1 illustrates a cross-sectional view 100 of an ESD protection device 105A in an integrated circuit device according to some aspects of the present teachings. The ESD protection device 105A includes a pull-down diode 167A formed in a first region 153 and a pull-up diode 133A formed in a second region 149 of the semiconductor substate 159. A first top metal structure 171 may couple the pull-down diode 167A to an I/O terminal. The I/O terminal may be solder bump 101 or some other structure through which an electrical connection to an external device may be made. A first bottom metal structure 155 may couple pull-down diode 167A to a $V_{SS}$ rail. The $V_{SS}$ rail may extend from the first bottom metal structure 155 and may connect to an anode of a power supply through a solder bump 151 or like structure.

A second top metal structure 107 may couple the pull-up diode 133A to the I/O terminal. This connection may also be through the solder bump 101 or some other structure. The solder bump 101 is shown twice to clarify that each of the pull-down diode 167A and the pull-up diode 133A has a connection to the I/O terminal. A second bottom metal structure 145 may couple the pull-up diode 133A to a $V_{DD}$ rail. The $V_{DD}$ rail may extend from second bottom metal structure 145 and may connect to a cathode of the power supply through a solder bump 147 or like structure.

The pull-down diode 167A includes heavily N-doped regions 165A adjacent a front side 124 of the semiconductor body 159A. The heavily N-doped regions 165A have edges in alignment with a gate structure 114A formed on the front side 124 and may have additional edges determined by dielectric structures such as shallow trench isolation (STI) regions 129 or the like. The heavily N-doped regions 165A provide N-doped contacts 166A on front side 124. N-terminals of the pull-down diode 167A are connected to the first top metal structure 171 through the N-doped contacts 166A. Salicide pads 125A may be disposed on the N-doped contacts 166A to reduce the connection resistance. Metal plugs 123 may also be part of the connecting structure. Metal plugs 123 may be tungsten (W), copper (Cu), cobalt (Co), titanium (Ti), titanium nitride (TiN) or the like, or any other suitable material for making this type of connection.

The pull-down diode 167A may include heavily P-doped regions 161A adjacent the back side 138 of the semiconductor body 159A. The heavily P-doped regions 161A also have edges aligned with the gate structures 114A. The heavily P-doped regions 161A provide P-doped contacts 158A on the back side 138. P-terminals of the pull-down diode 167A are connected to the first bottom metal structure 155 through the P-doped contacts 158A. A silicide pad 156A may be disposed on P-doped contacts 158A to reduce the connection resistance. The salicide pads 125A, 137A, and 156A may include any suitable silicide. A suitable silicide may be, for example, a titanium silicide ($TiSi_2$), a tungsten silicide ($WSi_2$), a tantalum silicide ($TaSi_2$), a nickel silicide (NiSi), a cobalt silicide ($CoSi_2$), platinum silicide (PtSi), or the like.

In view of the relatively large area for interfacing with the pull-down diode 167A on the back side 138, the ESD protection device 105A may be operative without the heavily P-doped regions 161A. In such cases a P-well may provide a P-doped contact 158A Eliminating the heavily P-doped regions 161A may simplify manufacture of the ESD protection device 105A. Another option is to form a single heavily P-doped region 161A that extends across the back side 138 beneath the pull-down diode 167A.

The P-well 163A extends from the heavily N-doped regions 165A to the heavily P-doped regions 161A adjacent the back side 138. The P-well 163A also extends from the front side 124 to the back side 138. The P-well 163A is disposed between the heavily P-doped regions 161A and underneath the gate structures 114A. The P-well 163A may be formed by doping the semiconductor body 159A or may simply be the semiconductor body 159A if the semiconductor body 159A is originally P-doped.

The pull-down diode 167A is an N+/P-well diode in that it comprises PN junctions 164A formed by interfaces between the heavily N-doped regions 165A and the P-well 163A, which is not heavily doped. The P-well 163A may be electrically coupled to the $V_{SS}$ rail and effectively held at a voltage of the power supply anode. The pull-down diode 167A is a gate-aligned diode. A gate-aligned diode is one that includes a PN junction having an edge aligned with a gate structure. The PN junctions 164A of pull-down diode 167A have edges aligned to the gate structures 114A.

The pull-up diode 133A includes heavily P-doped regions 127A adjacent a front side 124 of the semiconductor body 159A. The heavily P-doped regions 127A have edges in alignment with a gate structure 115A formed on the front side 124 and may have additional edges determined by dielectric structures such as shallow trench isolation (STI) regions 129 or the like. The heavily P-doped regions 127A provide P-doped contacts 116A on the front side 124. P-terminals of pull-up diode 133A are connected to the second top metal structure 107 through the P-doped contacts 116A. Salicide pads 125A may be disposed on P-doped contacts 116A to reduce the connection resistance. Metal plugs 123 may also be part of the connecting structure.

The pull-up diode 133A may include heavily N-doped regions 135A adjacent the back side 138 of the semiconductor body 159A. In this example, the heavily N-doped regions 135A also have edges aligned with one of the gate structures 115A. The heavily N-doped regions 135A provide N-doped contacts 139A on the back side 138. N-terminals of pull-up diode 133A are connected to the second bottom metal structure 145 through the N-doped contacts 139A. A salicide pad 137A may be disposed on N-doped contacts 139A to reduce the connection resistance. As was said for the heavily P-doped regions 161A, the ESD protection device 105A may be operative without the heavily N-doped regions 135A. In such cases an N-well 131A may provide an N-doped contact 139A.

The N-well 131A extends from the heavily P-doped regions 127A to the heavily N-doped regions 135A adjacent the back side 138. The N-well 131A also extends from the front side 124 to the back side 138. The N-well 131A is disposed between the heavily N-doped regions 135A and underneath one of the gate structures 115A. The N-well 131A may be formed by doping the semiconductor body 159A or may simply be the semiconductor body 159A if the semiconductor body 159A is originally N-doped.

The pull-up diode 133A is a P+/N-well diode in that it comprises PN junctions 130A formed by interfaces between the heavily P-doped regions 127A and the N-well 131A, which is not heavily doped. The N-well 131A may be electrically coupled to the $V_{DD}$ rail and effectively held at a voltage of the power supply cathode. The pull-up diode 133A is also a gate-aligned diode. The PN junctions 130A of pull-up diode 133A have edges aligned to the gate structure 115A.

The gate structures 114A, 115A may be dummy gates, polysilicon gates, metal gates, the like, or any other type of gate. The gate structures 114A, 115A may include a gate electrode 117 and a gate dielectric 119 disposed between the gate electrode 117 and the semiconductor body 159A. The gate structures 114A, 115A further include spacers 121 to the sides of gate electrode 117. The spacers 121 may be silicon nitride (SiN), silicon oxynitride (SiON), silicon carbonitride (SiCN), or the like, another dielectric, or any other material operative as a mask when doping the semiconductor body 159A.

The alignment with a gate structure or an edge of a gate structure referred to herein is the alignment that results from using all or part of the gate structure as a mask for a dopant implant. A gate-aligned diode is a diode having a PN junction the location of which is determined by a doping profile having this type of alignment. The alignment is the same as for the source regions-channel and drain region-channel junctions in a transistor with a self-aligned gate. In the self-aligned gate, source and drain implants are formed using either the gate electrode as a mask or the gate electrode plus sidewall spacers as a mask. In either case, horizontal alignment between the gate electrode and edges of the source and drain regions is established without the use of lithography. The self-aligned doping may provide two PN junctions that are approximately symmetrical and located on two opposite sides of the gate structure.

As shown in FIG. 1, the heavily N-doped regions 165A and the heavily P-doped regions 127A proximate the front side 124 and the heavily P-doped regions 161A and the heavily N-doped regions 135A proximate the back side 138 have been formed by dopant implants masked by the gate structures 114A and 115A including the spacers 121. This is emphasized by showing these heavily doped regions having boundaries that are perfectly horizontally aligned with edges of the spacers 121. In practice, the alignment is only approximate. Due to effects including diffusion of dopants, the edges of the heavily doped regions are located underneath the spacers 121. The heavily doped regions generally terminate short of and do not extend underneath the gate electrodes 117. As a consequence, the PN junctions 164A and 130A generally extend underneath and terminate underneath the spacers 121.

Heavily doped regions are degenerately doped regions of a semiconductor substrate. A degenerately doped region of a semiconductor substrate is one in which the doping concentration is sufficiently high to cause the conductivity of the semiconductor to be similar to that of a metal. In some embodiments, the heavily doped regions have a dopant concentration of $10^{19}/cm^3$ or greater. In some embodiments, heavily doped regions have a dopant concentration of $10^{20}/cm^3$ or greater. The N-wells and P-wells of the present disclosure may have moderate doping levels that may be relatively high but are not degenerate. In some embodiments, these doping levels are in a range from $10^{13}/cm^3$ to $10^{18}/cm^3$. In some embodiments, these doping levels are in a range from $10^{15}/cm^3$ to $10^{18}/cm^3$. In some embodiments, these doping levels are in a range from $10^{16}/cm^3$ to $10^{18}/cm^3$. Relatively high doping concentrations reduce the resistances of the pull-down diode 167A and the pull-up diode 133A.

The first top metal structure 171 and the second top metal structure 107 are both part of a metal interconnect structure 169 formed on the front side 124 of the semiconductor body 159A. The metal interconnect structure 169 includes a plurality of metallization layers 111 (e.g., M0, M1, M2, . . ., $M_{top}$) and vias 113 in a dielectric matrix 109. If the first top metal structure 171 and the second top metal structure 107 are both connected to the same terminal or rail they may be one continuous metal structure. The first bottom metal structure 155 and the second bottom metal structure 145 are both part of a bottom metal interconnect structure 157 formed on the back side 138 of the semiconductor body 159A. The bottom metal interconnect structure 157 includes a plurality of metallization layers 141 (e.g., BM0, BM1, . . ., $BM_{top}$) and vias 140 in a dielectric matrix 143.

In some embodiments, the P-well 163A is isolated from the N-well-131A by an STI region 129 or like dielectric structure. But if the P-well 163A is coupled to $V_{SS}$ and the N-well 131A is coupled to $V_{DD}$, then a junction between the P-well 163A and the N-well-131A will be reverse biased. Accordingly, the P-well 163A and the N-well-131A may abut, although the silicide pads 156A and 137A should still be isolated.

The ESD protection device 105A has been described as using the metal structures 107 and 171 on the front side 124 for the I/O terminal connections and the metal structure 145 and 155 on the back side 138 for the $V_{SS}$ rail and $V_{DD}$ rail connections. In an alternate embodiment, the metal structure 155 and the metal structure 145 on the back side are used for the I/O terminal connections, the metal structure 171 for the $V_{DD}$ rail connection, and the metal structure 107 for the $V_{SS}$ rail connection. In that configuration, the P-well 163A and the N-well-131A may float with the I/O terminal. If this alternate connection structure is to be used, the doping types of the P-well 163A and the N-well-131A may be reversed to avoid that floating.

The metallization layers 111, the metallization layers 141, the vias 113, and the vias 140 may be formed of any suitable metal or metals such as copper (Cu), aluminum (Al), gold (Au), tungsten (W), titanium nitride (TiN), or the like. The dielectric matrix 109 and the dielectric matrix 143 may include low-κ dielectrics or extremely low-κ dielectrics. A low-κ dielectric is a material having a smaller dielectric constant than $SiO_2$. $SiO_2$ has a dielectric constant of about 3.9. Examples of low-κ dielectrics include organosilicate glasses (OSG) such as carbon-doped silicon dioxide, fluorine-doped silicon dioxide (otherwise referred to as fluorinated silica glass (FSG), organic polymer low-κ dielectrics, and porous silicate glass. An extremely low-κ dielectric is a material having a dielectric constant of about 2.1 or less. An extremely low-κ dielectric material is generally a low-κ dielectric material formed into a porous structure. Porosity reduces the effective dielectric constant.

The semiconductor body 159A may be or comprise one or more layers of silicon (Si), geranium (Ge), silicon geranium (SiGe), oxide semiconductors such as indium gallium zinc oxide (IGZO), Group III-V materials such as indium gallium arsenide (InGaAS), or the like. Some layers of the semiconductor body 159A may be formed by epitaxial growth. The semiconductor body 159A may be part of a semiconductor substrate such as a wafer or die. In some embodiments, the semiconductor substrate is silicon on insulator (SOI). The semiconductor body 159A may support a variety of devices including devices that form a circuit protected by the ESD protection device 105A.

The semiconductor body 159A may be very thin. In some embodiments, a thickness 136A of the semiconductor body 159A is 5 μm or less as measured from the front side 124 to the back 138 through either pull-down diode 167A or pull-up diode 133A. In some embodiments, the thickness 136A is 1 μm or less. In some embodiments, the thickness 136A is 400 nm or less. Keeping the thickness 136A small facilitates keeping the resistances of pull-down diode 167A and pull-up diode 133A low. Reducing the resistances of pull-down diode 167A and pull-up diode 133A extends the ESD protection afforded by ESD protection device 105A.

Another parameter that may relate more closely to the resistances of the pull-down diode 167A and the pull-up diode 133A is a span 134A of a moderately doped portion of the pull-down diode 167A or the pull-up diode 133A. The span 134A of the moderately doped portion of pull-up diode 133A is a distance from the heavily P-doped regions 127A to the heavily N-doped regions 135A. If the heavily N-doped regions 135A were eliminated, the span 134A would be a distance from the heavily P-doped regions 127A to the back side 138. Likewise, the span 134A of the moderately doped portion of pull-down diode 167A is a distance from the heavily N-doped regions 165A to the heavily P-doped regions 161A. If the heavily P-doped regions 161A were eliminated, the span 134A for pull-down diode 167A would be a distance from the heavily N-doped regions 165A to the back side 138. In some embodiments, the span 134A is 1 μm or less. In some embodiments, the span 134A is less than 400 nm or less. In some embodiments, the span 134A is in a range from 30 nm to 150 nm.

FIGS. 2A and 2B illustrate a front side 201 and a back side 202 of an integrated circuit device 200 focusing on an edge portion that includes a version of the ESD protection device 105A. As shown in FIG. 2A, the solder bump 101 may be positioned on the front side 124 over pull-down diode 167A. In this version, the solder bump 101 is not required as the first top metal structure 171 and the second top metal structure 107 are united. As shown by the illustration, the ESD protection device 105A may be one in an array of like devices in the integrated circuit device 200.

As shown in FIG. 2B, the solder bump 151 providing a $V_{SS}$ connection may be offset from the pull-down diode 167A. The first bottom metal structure 155 may be a part of a larger metal structure 203 extending from the solder bump 151 to underneath pull-down diode 167A. The larger metal structure 203 may be operative as a $V_{SS}$ rail providing a $V_{SS}$ connection for a plurality of ESD protection devices 105A and potentially for other devices as well. Likewise, the solder bump 147 providing a $V_{DD}$ connection may be offset from the pull-up diode 133A. The second bottom metal structure 145 may be a part of a larger metal structure 205 extending from the solder bump 147 to underneath pull-up diode 133A. The larger metal structure 205 may be operative as a $V_{DD}$ rail providing a $V_{DD}$ connection for a plurality of ESD protection devices 105A and potentially for other devices as well.

FIGS. 3A and 3B illustrate a front side 301 and a back side 303 of an integrated circuit device 300 that may include the ESD protection device 105A while having all the solder bumps on one side. As shown in FIG. 3A and 3B, the solder bump 151 providing a $V_{SS}$ connection may be on the front side 301 and connected to the larger metal structure 203 on the back side 303 by a through silicon via 305. Likewise, the solder bump 147 providing a $V_{DD}$ connection may be on the front side 301 and connected to the larger metal structure 205 on the back side 303 by a another through silicon via 307.

Figure 4A:
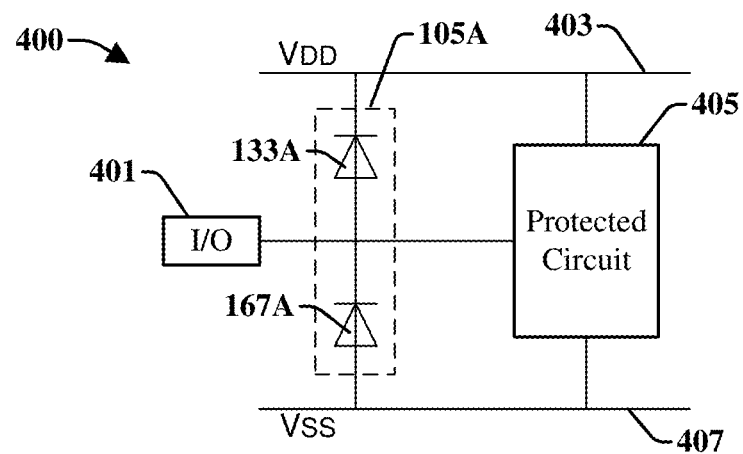
FIG. 4A provides a diagram for a circuit that may include a diode according to the present teachings.

FIG. 4A provides a diagram for a circuit 400 that may include ESD protection device 105A. In the circuit 400, the pull-down diode 167A is connected between an I/O terminal 401 and a $V_{SS}$ rail 407. Provided that the resistance of the pull-down diode 167A is sufficiently low, a negative voltage spike on I/O terminal 401 will discharge through the pull-down diode 167A rather than through the protected circuit 405. The pull-up diode 133A is connected between the I/O terminal 401 and a $V_{DD}$ rail 403. Provided the resistance of the pull-up diode 133A is sufficiently low, a positive voltage spike on the I/O terminal 401 will discharge through the pull-up diode 133A rather than through the protected circuit 405. Provided the capacitances of the pull-up diode 133A and the pull-down diode 167A are sufficiently low, signals entering through the I/O terminal 401 will be faithfully transmitted to the protected circuit 405.

Figure 4B:
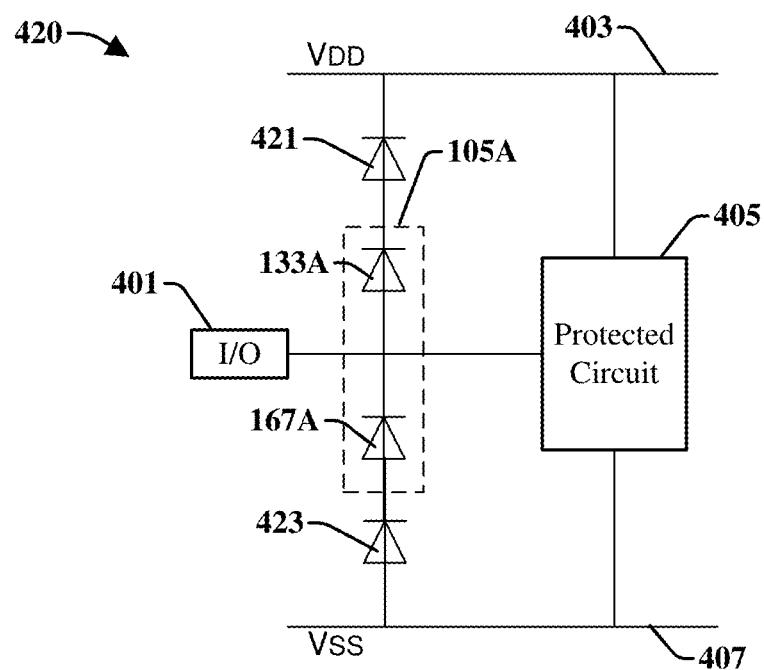
FIG. 4B provides a diagram for another circuit that may include a diode according to the present teachings.

FIG. 4B provides a diagram for a circuit 420 that may also include the ESD protection device 105A. In the circuit 420, pull-down diode 167A is connected between the I/O terminal 401 and the $V_{SS}$ rail 407 in series with a second pull-down diode 423. The pull-up diode 133A is connected between the I/O terminal 401 and the $V_{DD}$ rail 403 in series with a second pull-up diode 421. This configuration expands the voltage range over which ESD protection will not be triggered. The pull-down diode 167A and the pull-up diode 133A may be used individually or in combination as diodes in any ESD protection circuit or any other device in which their characteristics of low capacitance or low resistance are desirable.

Figure 5:
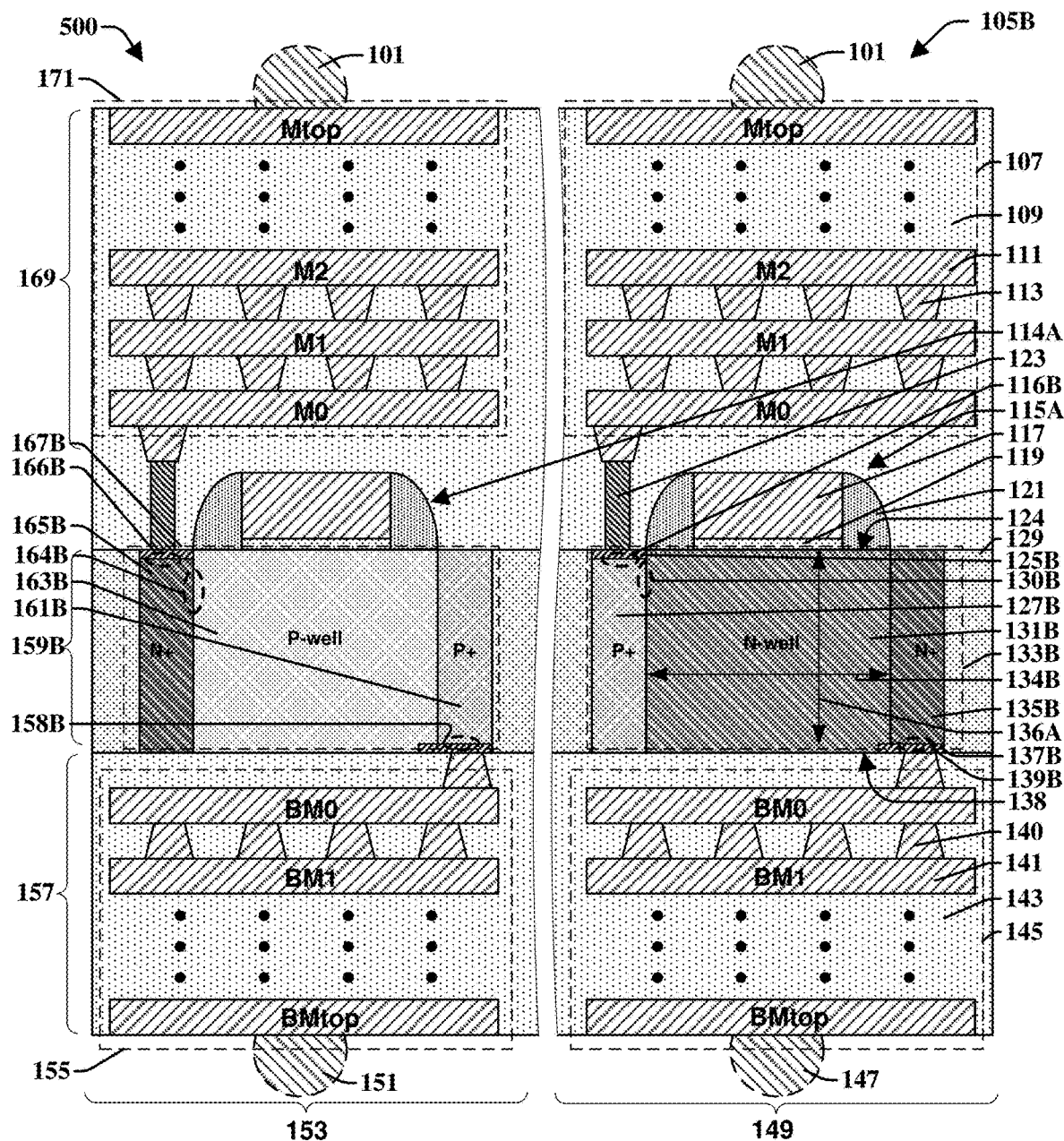
FIG. 5 illustrates a cross-sectional view of an ESD protection device in an integrated circuit device according to some other aspects of the present teachings.

FIGS. 5-9 illustrate cross-sectional views 500-900 of ESD protection devices 105B-F having pull-down diodes 167B-F respectively in place of pull-down diode 167A and pull-up diodes 133B-F respectively in place of pull-up diode 133A. The comments made regarding the structures in cross-sectional view 100 apply to the corresponding structures illustrated by cross-sectional views 500-900 except for the differences shown in the figures or noted in the following description The cross-sectional view 500 of FIG. 5 illustrates an ESD protection device 105B that include a pull-down diode 167B and a pull-up diode 133B. The pull-down diode 167B includes a heavily N-doped region 165B and a heavily P-doped region 161B that are aligned to opposite sides of the gate structure 114A formed on the front side 124. The heavily N-doped region 165B provides a front side contact 166B and the heavily P-doped region 161B provides a back side contact 158B. A P-well 163B disposed underneath the gate structure 114A extends from the heavily N-doped region 165B to the heavily P-doped region 161B. A PN junction 164B is formed by an interface between the heavily N-doped region 165B and the P-well 163B. Accordingly, the pull-down diode 167B is a gate-aligned N+/P-well junction diode.

The pull-up diode 133B includes a heavily P-doped region 127B and a heavily N-doped region 135B that are aligned to opposite sides of a gate structure 115A formed on the front side 124. The heavily P-doped region 127B provides a front side contact 116B and the heavily N-doped region 135B provides a back side contact 139B. An N-well 131B disposed underneath the gate structure 115A extends from the heavily P-doped region 127B to the heavily N-doped region 135B. A PN junction 130B is formed by an interface between the heavily P-doped region 127B and the N-well 131B. Accordingly, the pull-up diode 133B is a gate-aligned P+/N-well junction diode.

A width 134B of the N-well 131 B is approximately the same as a width of the gate structure 115A and is a span from the heavily P-doped region 127B to the heavily N-doped region 135B. Reducing the width 134B reduces a resistance of the pull-up diode 133B. In some embodiments, the width 134B is 400 nm or less. In some embodiments, the width 134B is less than 100 nm or less. In some embodiments, the width 134B is 28 nm or less. The resistance of the pull-up diode 133B may also be reduced by increasing the depths of the heavily P-doped region 127B to the heavily N-doped region 135B. In some embodiments, the heavily P-doped region 127B and the heavily N-doped region 135B extend from the front side 124 to the back side 138. In general, the pull-up diode 133B may have a lower resistance within the body 159B than the pull-up diode 133A. This advantage may be offset by a reduced area available for interfacing the pull-up diode 133B with the second top metal structure 107 and the second bottom metal structure 145 as compared to the area available for interfacing the pull-up diode 133A with these structures. For example, the area available for salicide pads 125B and silicide pads 137B, is less than the area available for salicide pads 125A and silicide pads 137A. It will be appreciated that the pull-down diode 167B and the pull-down diode 167A are subject to a like comparison.

Figure 6:
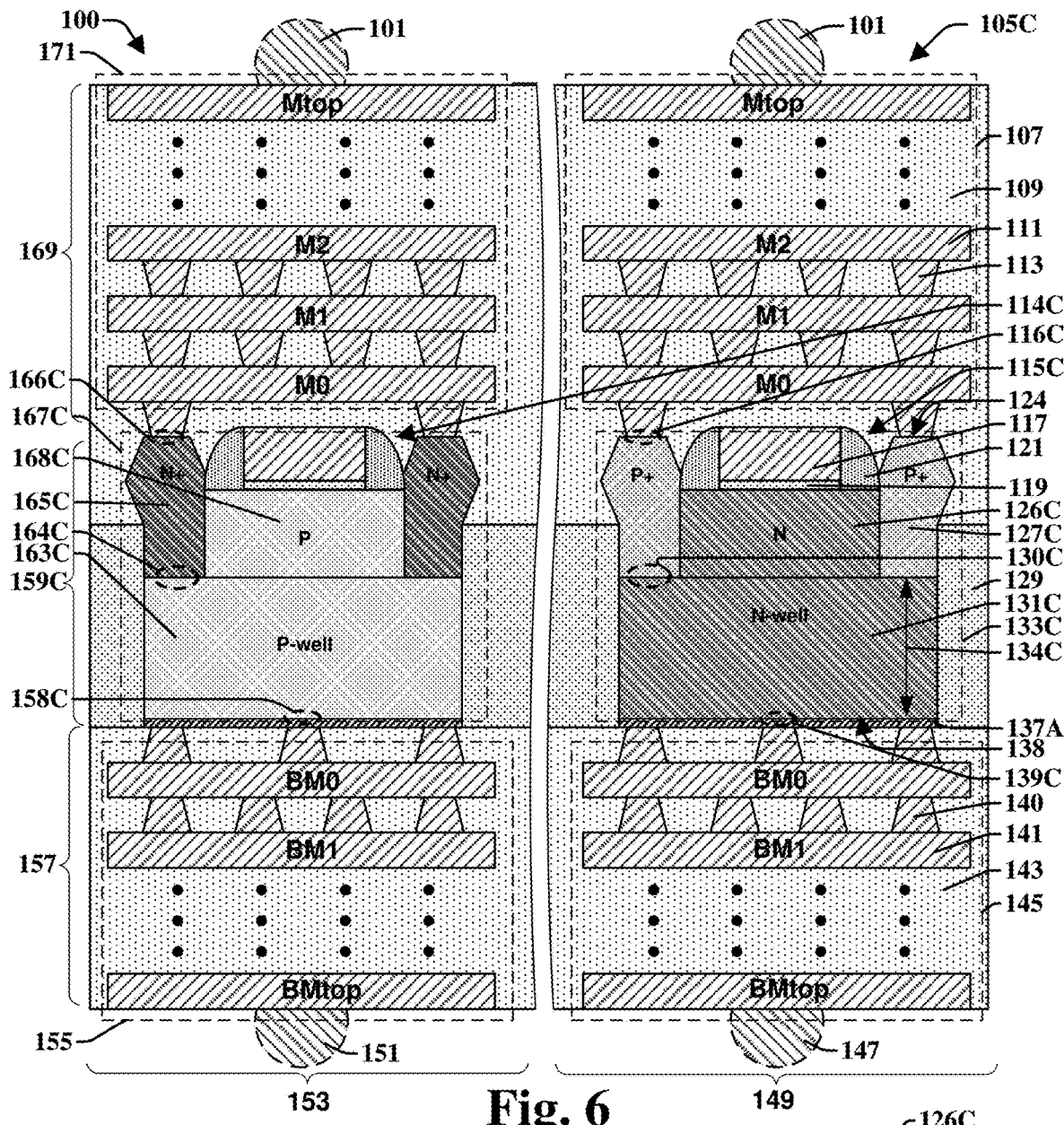
FIG. 6 illustrates a cross-sectional view of an ESD protection device in an integrated circuit device according to some other aspects of the present teachings.

The cross-sectional view 600 of FIG. 6 illustrates an ESD protection device 105C that include a pull-down diode 167C and a pull-up diode 133C. The pull-down diode 167C includes two heavily N-doped regions 165C that are aligned to opposite sides of a gate structure 115C. The two heavily N-doped regions 165C may include doped areas of and/or epitaxial growths on a semiconductor fin 168C. The heavily N-doped regions 165C provide front side contacts 166C. The semiconductor fin 168C is P-doped between the heavily N-doped regions 165C but could be N-doped instead. A P-well 163C disposed underneath the semiconductor fin 168C extends to the back side 138 and provides a back side contact 158C. PN junctions 164C are formed by interfaces between the heavily N-doped regions 165C and the P-well 163C. Accordingly, the pull-down diode 167C is a gate-aligned N+/P-well junction diode.

The pull-up diode 133C includes two heavily P-doped region 127C that are aligned to opposite sides of the gate structure 115C. The two heavily P-doped regions 127C may include doped areas of and/or epitaxial growths on a semiconductor fin 126C. The heavily P-doped regions 127C provide front side contacts 116C. The semiconductor fin 126C is N-doped between the heavily P-doped regions 127C but could be P-doped instead. An N-well 131C disposed underneath the semiconductor fin 126C extends to the back side 138 and provides a back side contact 139C. PN junctions 130C are formed by interfaces between the heavily P-doped regions 127C and the N-well 131C. Accordingly, the pull-up diode 133C is a gate-aligned P+/N-well junction diode.

A thickness 134C of the semiconductor body 159C below the semiconductor fin 168C separates the heavily N-doped regions 165C from the back side contact 158C. The same thickness 134C separates the heavily P-doped regions 127C from the back side contact 139C. Reducing the thickness 134C reduces the resistances of the pull- down diode 167C and the pull-up diode 133C. In some embodiments, the thickness 134C is 5 µm or less. In some embodiments, the thickness 134C is 1 µm or less. In some embodiments, the thickness 134C is 400 nm or less.

The pull-down diode 167C and the pull-up diode 133C do not have heavily doped semiconductor adjacent their back side contacts 158C and 139C, but these contacts have a comparatively large area. In some embodiments, the back side contact 158C has an area equal to an area of the P-well 163C. In some embodiments, the back side contact 139C has an area equal to an area of the N-well 131C. In an alternative embodiment, the dopings of the heavily N-doped regions 165C and the heavily P-doped regions 127C are modified to correspond to the pattern shown by the cross-sectional view 500 of FIG. 5, thereby providing heavy doping for back side contacts and a short horizontal path across moderately doped portions of the pull-down diode 167C and the pull-up diode 133C.

Figure 6A:
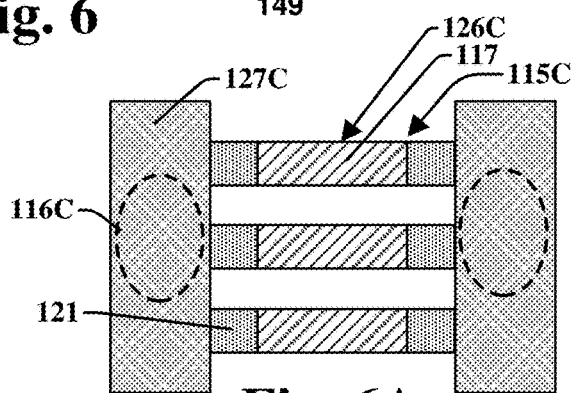
FIG. 6A illustrates a top view of a gate structure of FIG. 6.

The gate structures 114C and 115C may be single fin or multi-fin gate structures. FIG. 6A illustrates a top view of the gate structure 115C in an example in which the gate structures 114C and 115C are triple fin gates. Epitaxial growths on the semiconductor fins 126C increase an area available for the front side contacts 116C. Increasing the area of the front side contacts 116C reduce the resistance of the pull-up diode 133C. The area may be further increased by a multi-fin gate structure: the growths on adjacent fins merge to form relatively large heavily P-doped regions 127C as shown in FIG. 6A. Heavily P-doped regions 127C and heavily N-doped regions 165C may be silicided where they form front side or back side contacts.

Figure 7:
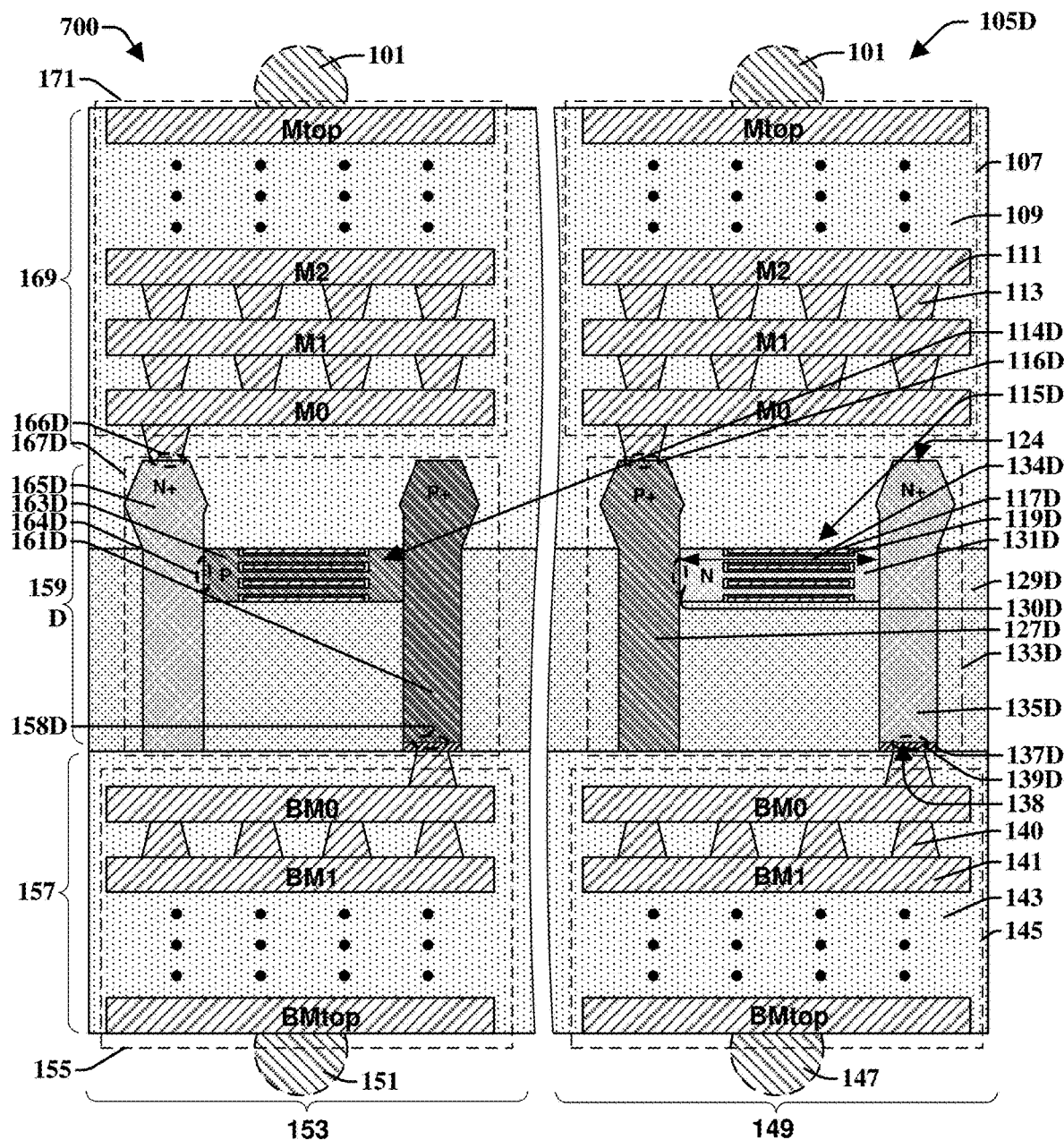
FIG. 7 illustrates a cross-sectional view of an ESD protection device in an integrated circuit device according to some other aspects of the present teachings.

The cross-sectional view 700 of FIG. 7 illustrates an ESD protection device 105D that include a pull-down diode 167D and a pull-up diode 133D formed in a semiconductor body 159D. The pull-down diode 167D includes a heavily N-doped region 165D and a heavily P-doped region 161D formed on opposite sides of a P-doped fin 163D. The heavily N-doped region 165D provides a front side contact 166D and the heavily P-doped region 161D provides a back side contact 158D. Silicide pad 137D may be formed on the back side contact 158D. The gate structure 114D includes a gate electrode 117D formed by a plurality of nanosheets. The nanosheets are separated from the P-doped fin 163D by gate dielectric 119D. The P-doped fin 163D may overlie dielectric 129D, extending from the heavily N-doped region 165D to the heavily P-doped region 161D, and function as a P-well for the pull-down diode 167D. A PN junction 164D is formed by an interface between the heavily N-doped region 165D and the P-doped fin 163D. Accordingly, the pull-down diode 167D is an N+/P-well junction diode. A span 134D of the moderately doped portion of the pull-down diode 167D may be limited to a width of the P-doped fin 163D.

The pull-up diode 133D includes a heavily P-doped region 127D and a heavily N-doped region 135D formed on opposite sides of An N-doped fin 131D. The heavily P-doped region 127D provides a front side contact 116D and the heavily N-doped region 135D provides a back side contact 139D. The gate structure 115D includes a gate electrode 117D formed by a plurality of nanosheets. The nanosheets are separated from the N-doped fin 131D by gate dielectric 119D. The N-doped fin 131D may overlie dielectric 129D and function as an N-well for the pull-up diode 133D extending from the heavily P-doped region 127D to the heavily N-doped region 135D. A PN junction 130D is formed by an interface between the heavily P-doped region 127D and the N-doped fin 131D. Accordingly, the pull-up diode 133D is an P+/N-well junction diode. The pull-down diode 167D and the pull-up diode 133D may be formed on insulator using a same set of processes used to form transistors with gate structures 114D and 115D.

Figure 8:
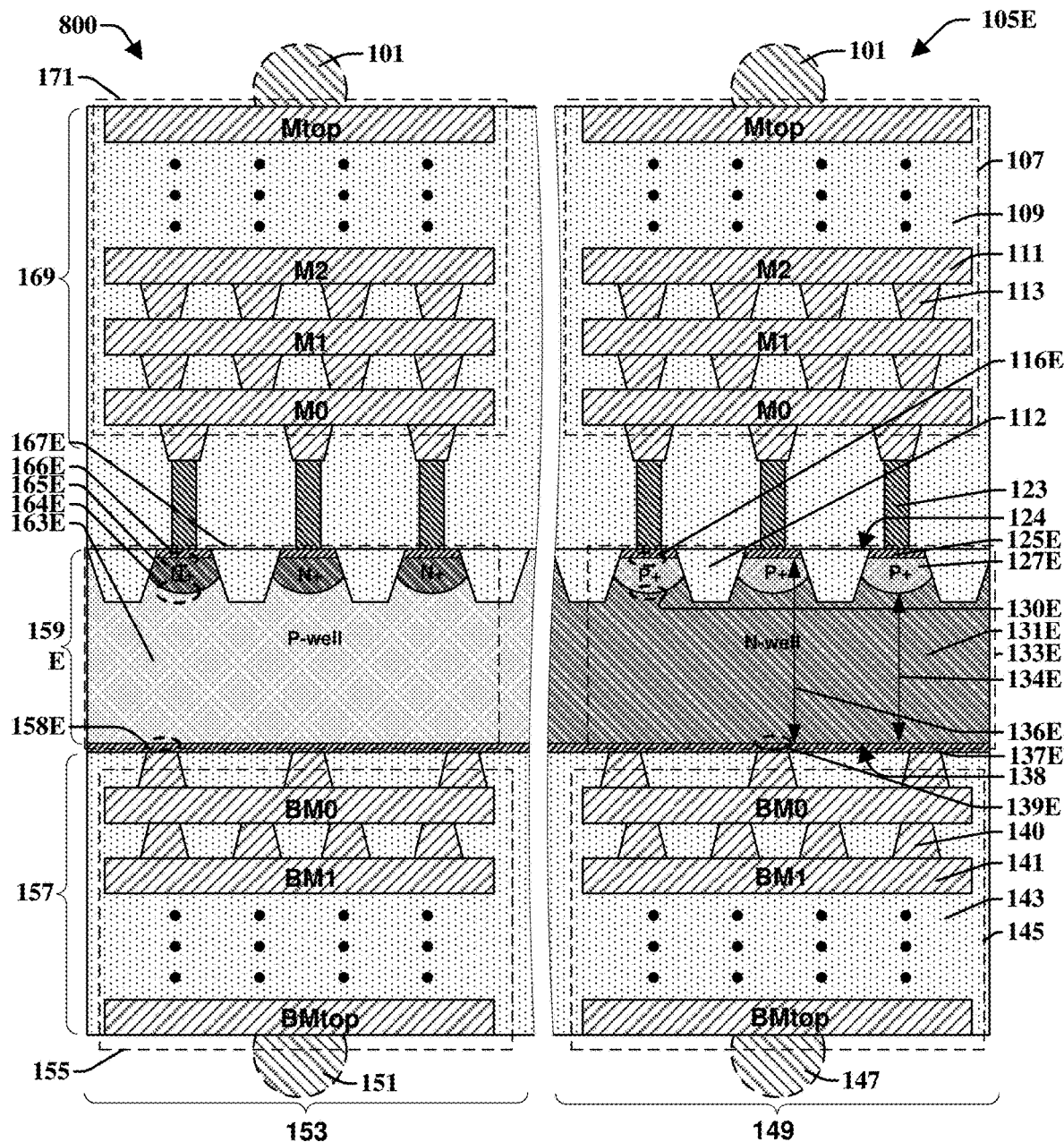
FIG. 8 illustrates a cross-sectional view of an ESD protection device in an integrated circuit device according to some other aspects of the present teachings.

The cross-sectional view 800 of FIG. 8 illustrates an ESD protection device 105E that include a pull-down diode 167E and a pull-up diode 133E formed in a semiconductor body 159E. The pull-down diode 167E includes a heavily N-doped region 165E bounded on all sides by STI regions 112. The pull-down diode 167E includes two heavily N-doped regions 165E separated by an STI region 112 but eliminating the STI regions 112 between heavily N-doped region 165E is an option. The heavily N-doped regions 165E provides front side contacts 166E on which may be formed silicide 125E. A P-well 163E disposed underneath the heavily N-doped regions 165E extends to the back side 138 and provides back side contact 158E. Optionally, a heavily doped deep P-well may be inserted between the P-well 163E and the back side 138 to provide heavy doping adjacent the back side contact 158E. The P-well 163E may extend underneath one or more of the STI regions 112 from one of the heavily N-doped regions 165E to another of the heavily N-doped regions 165E. PN junctions 164E are formed by interfaces between the heavily N-doped regions 165E and the P-well 163E. Accordingly, the pull-down diode 167E is an STI N+/P-well junction diode.

The pull-up diode 133E includes a heavily P-doped region 127E bounded on all sides by STI regions 112. The pull-up diode 133E includes two heavily P-doped regions 127E separated by an STI region 112. The heavily P-doped regions 127E provides front side contacts 116E on which may be formed silicide 125E. An N-well 131E disposed underneath the heavily P-doped regions 127E extends to the back side 138 and provides back side contact 139E. Alternatively, a heavily doped deep N-well may be inserted between the N-well 131E and the back side 138 to provide the back side contact 139E. The N-well 131E may extend underneath one or more of the STI regions 112 from one of the heavily P-doped regions 127E to another of the heavily P-doped regions 127E. PN junctions 130E are formed by interfaces between the heavily P-doped regions 127E and the N-well 131E. Accordingly, the pull-up diode 133E is an STI P+/N-well junction diode.

A resistance of the pull-up diode 133E is proportional to a distance 134E from the heavily P-doped regions 127E to the back side 138. The distance 134E varies with a thickness 136E of the semiconductor body 159E. The semiconductor body 159E may be made thin in first region 153 and second region 149 to keep the resistances of the pull-down diode 167E and the pull-up diode 133E low.

Figure 9:
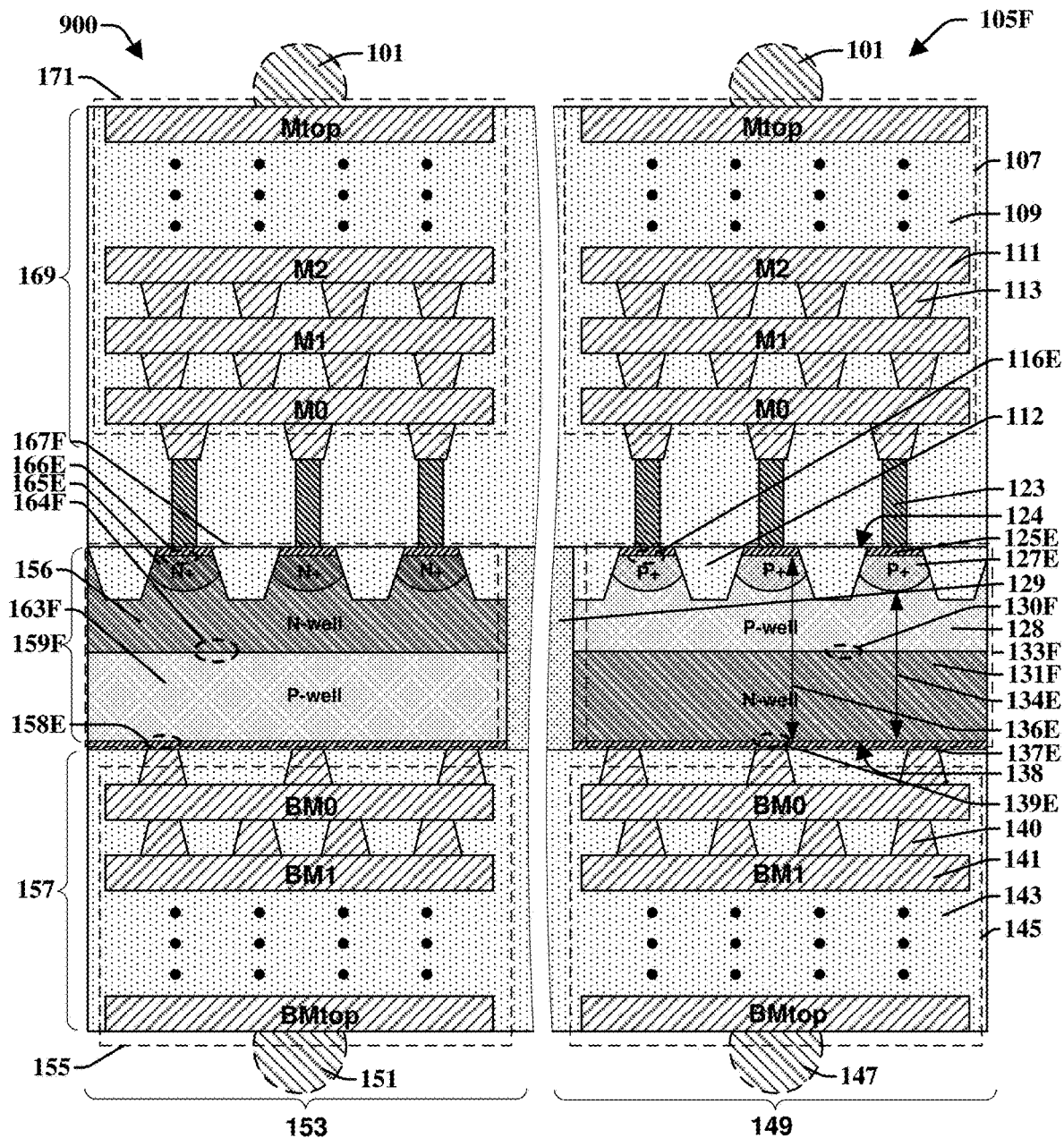
FIG. 9 illustrates a cross-sectional view of an ESD protection device in an integrated circuit device according to some other aspects of the present teachings.

The cross-sectional view 900 of FIG. 9 illustrates an ESD protection device 105F that include a pull-down diode 167F and a pull-up diode 133F formed in a semiconductor body 159F. The pull-down diode 167F is similar to the pull-down diode 167E of FIG. 8 except that in the pull-down diode 167F an N-well 156 is inserted between the heavily N-doped regions 165E and the P-well 163F. The pull-down diode 167F includes a PN junction 164F formed by an interface between the N-well 156 and the P-well 163F. Accordingly, pull-down diode 167E is an STI P-well/N-well junction diode.

The pull-up diode 133F is similar to the pull-up diode 133E of FIG. 8 except that in the pull-down diode 133F a P-well 128 is inserted between the heavily P-doped regions 127E and the N-well 131F. The pull-up diode 133F includes a PN junction 130F formed by an interface between the P-well 128 and the N-well 131F. Accordingly, pull-up diode 133F is an STI P-well/N-well junction diode. The pull-down diode 167F and the pull-up diode 133F may be better in terms of resistance or capacitance as compared to the pull-down diode 167E and the pull-up diode 133F respectively in some applications.

FIGS. 10-19 show cross-sectional views 1000-1900 illustrating a method of forming an integrated circuit device having diodes in accordance with some embodiments of the present disclosure. Although FIGS. 10-19 are described in relation to a method, it will be appreciated that the structures disclosed in FIGS. 10-19 are not limited to such a method, but instead may stand alone as structures independent of the method. Furthermore, although FIGS. 10-19 illustrate particular structures and compositions, the method is readily extendable to other structures and compositions within the scope of this disclosure.

Figure 10:
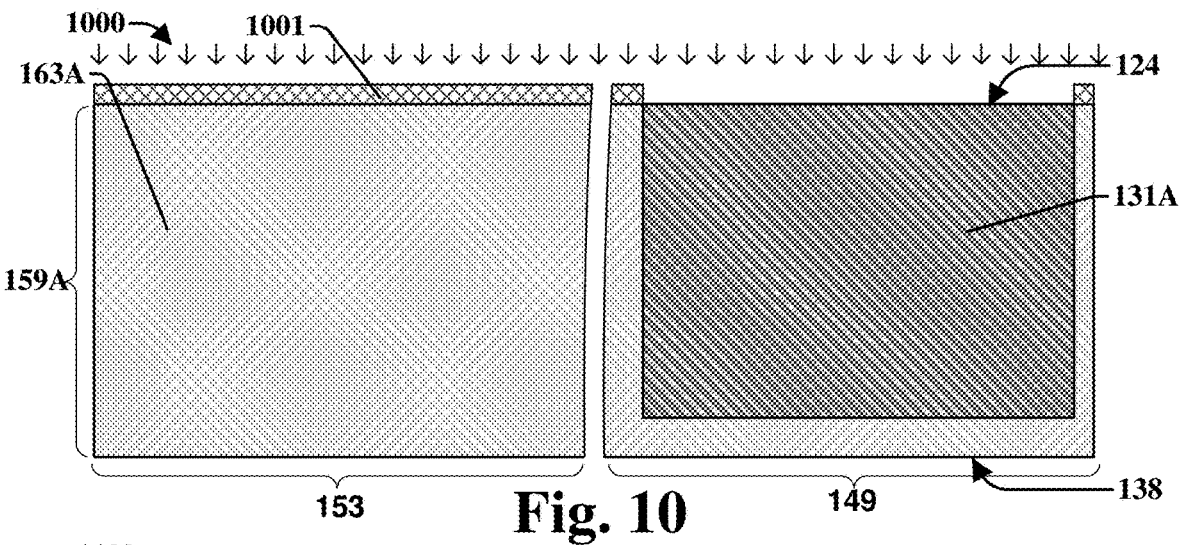
FIGS. 10-19 are a series of cross-sectional views illustrating a method of forming an integrated circuit device with an ESD protection device according to some aspects of the present teachings.

As shown by the cross-sectional view 1000 of FIG. 10, the process may begin with forming a photoresist mask 1001 and using it to mask first region 153 of the semiconductor body 159A while irradiating with a plasma to form an N-well 131A in the second region 149. The semiconductor body 159A may be initially P-doped, whereby the areas of the substrate that are not exposed to the plasma form P-well 163A. The photoresist mask 1001 is subsequently stripped.

Figure 11:
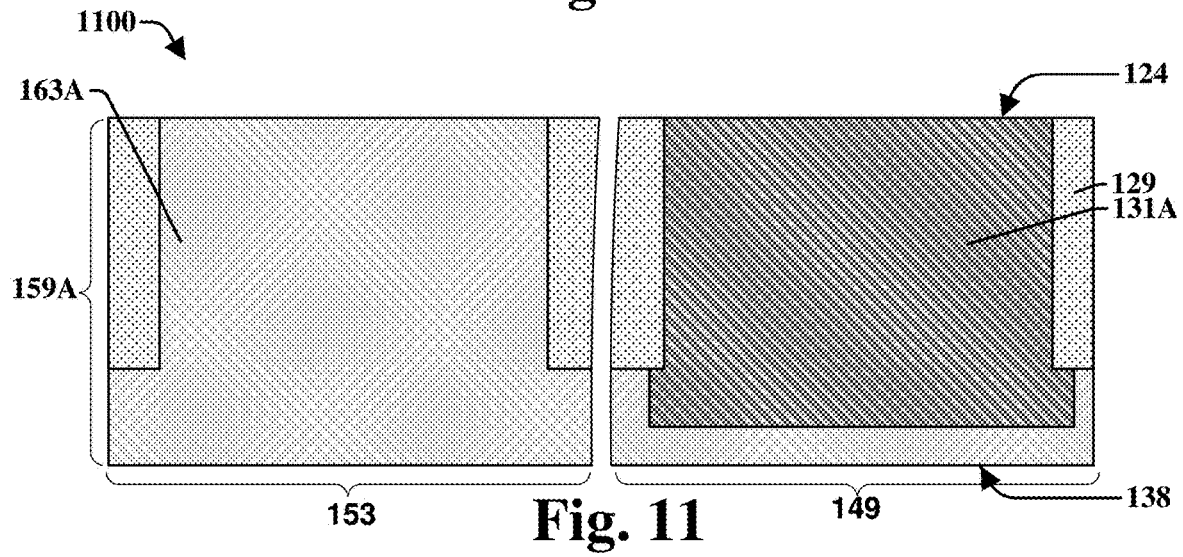

As shown by the cross-sectional view 1100 of FIG. 11, STI regions 129 may be formed in the semiconductor body 159A. Forming STI regions 129 may include forming trenches, depositing dielectric, and planarizing to remove the dielectric that deposited outside the trenches. Other types of isolation structures may be used in place of the STI regions 129. The STI regions 129 may be formed earlier or later in the process.

Figure 12:
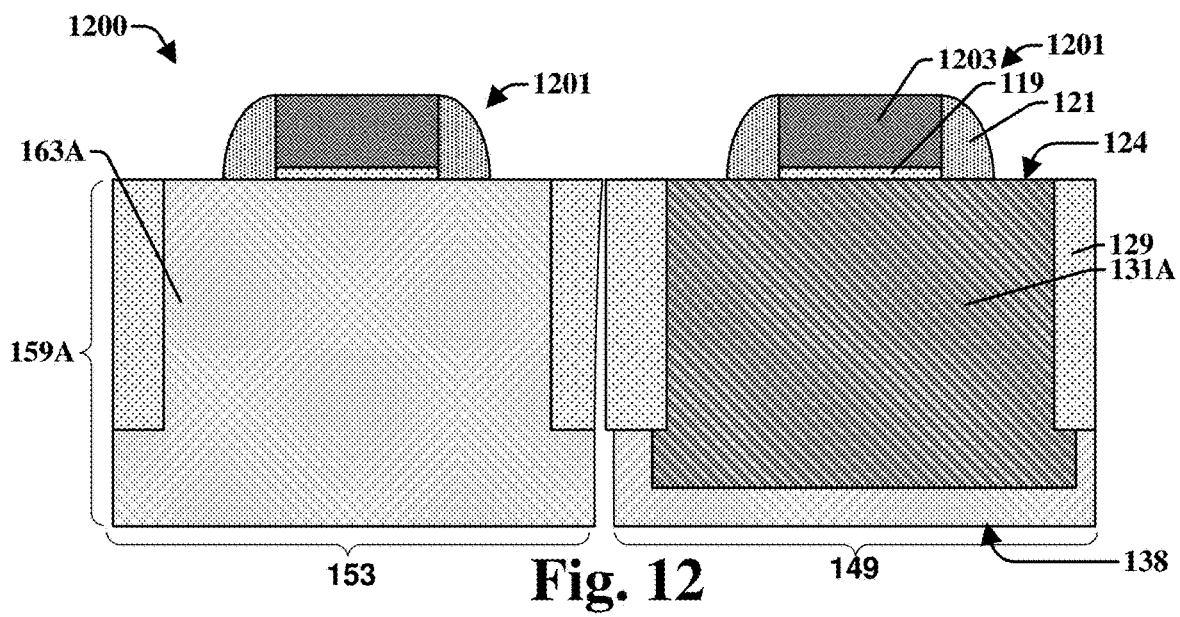

As shown by the cross-sectional view 1200 of FIG. 12, dummy gate structures 1201 may be formed over the structure shown by the cross-sectional view 1100 of FIG. 11. Dummy gate structures 1201 include dummy gate electrodes 1203, which may be polysilicon or the like. Dummy gate structures 1201 may include the gate dielectric 119 or another material that is subsequently replaced by the gate dielectric 119. Sidewall spacers 121 are formed around dummy gate electrodes 1203 and are considered part of the dummy gate structures 1201. Forming sidewall spacers 121 may include depositing a spacer material and then performing an anisotropic etch that leaves only the material that forms the sidewall spacers 121.

Figure 13:
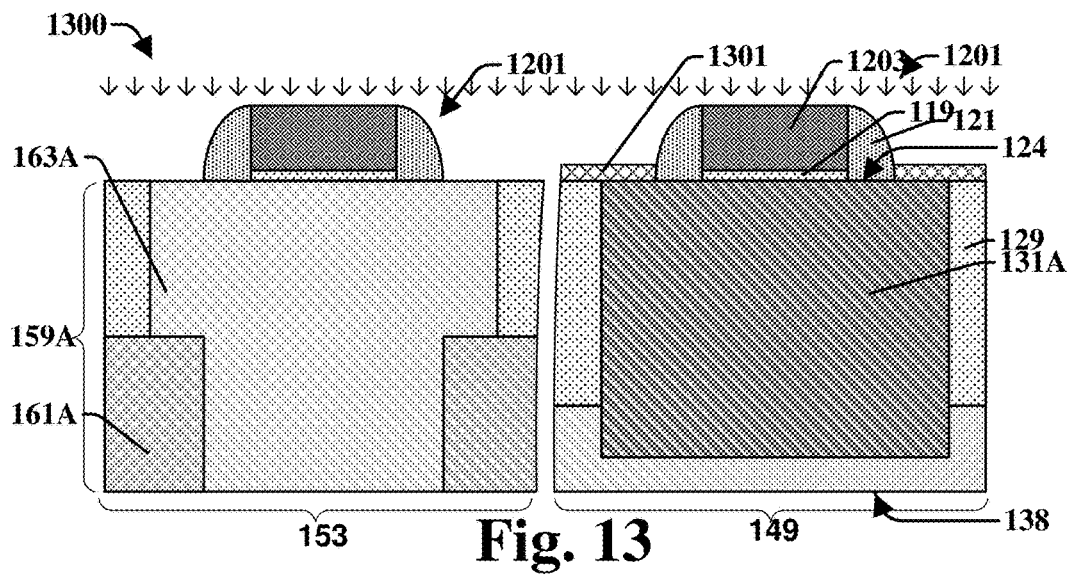

As shown by the cross-sectional view 1300 of FIG. 13, the second region 149 may be covered by a photoresist mask 1301 while heavily P-doped regions 161A are formed in the first region 153. A dummy gate structure 1201 masks a portion of the first region 153, whereby the heavily P-doped regions 161A form with edges aligned to edges of the dummy gate structure 1201. Heavily P-doped regions 161A may be formed by a high energy plasma implantation processes of a type that is used to form deep P-wells, e.g., a P-well that is beneath and spaced apart from the front side 129. The photoresist mask 1301 is subsequently stripped.

Figure 14:
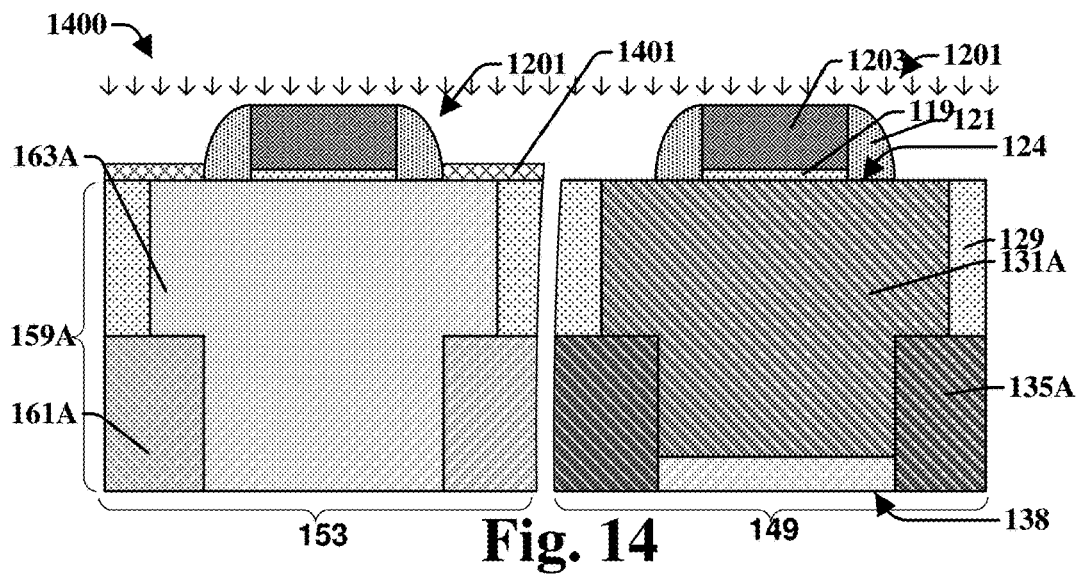

As shown by the cross-sectional view 1400 of FIG. 14, the first region 153 may be covered by a photoresist mask 1401 while heavily N-doped regions 135A are formed in the second region 149. A dummy gate structure 1201 masks a portion of the second region 149, whereby the heavily N-doped regions 135A form with edges aligned to edges of the dummy gate structure 1201. Heavily N-doped regions 135A may be formed by a high energy plasma implantation processes of a type that is used to form deep N-wells. That process may comprise irradiating the front side 124 with a high energy plasma. Alternatively, diffusion and/or epitaxial growth processes could be used to form buried layers that function like heavily P-doped regions 161A and heavily N-doped regions 135A but are not aligned to dummy gates 1201. Heavily P-doped regions 161A and heavily N-doped regions 135A that are not gate-aligned may also be formed by high energy plasma implantation before forming the dummy gate structures 1201.

Figure 15:
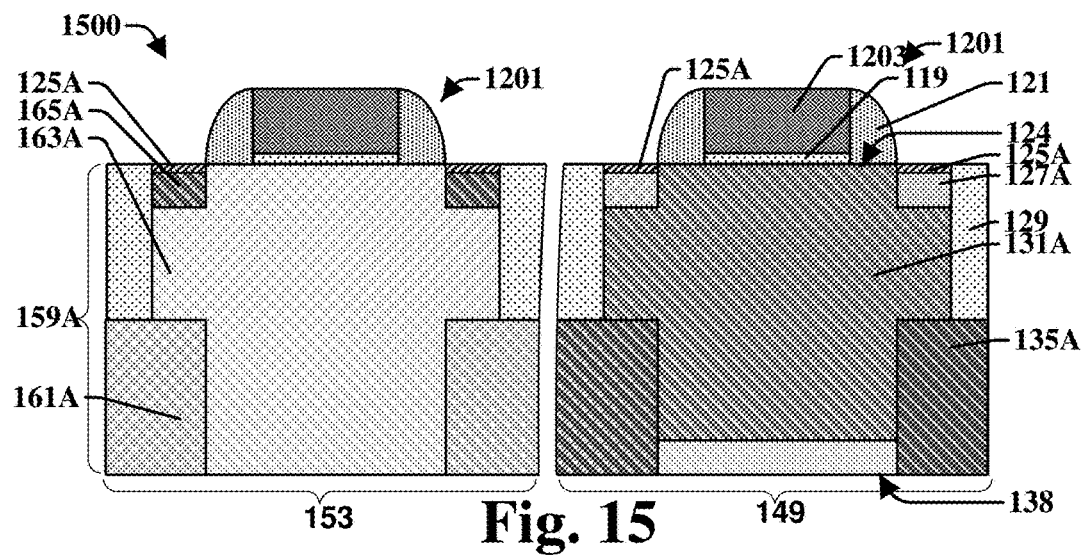

As shown by the cross-sectional view 1500 of FIG. 15, heavily N-doped regions 165A may be formed adjacent the front side 124 in alignment with the dummy gate structure 1201 in the first region 153 and heavily P-doped regions 127A may be formed adjacent the front side 124 in alignment with the dummy gate structure 1201 in the second region 149. These may be formed by two separate low energy implants completed with two separate masks. As further shown by the cross-sectional view 1500 of FIG. 15, salicide pads 125A may be formed on the heavily P-doped regions 127A and the heavily N-doped regions 165A.

Figure 16:
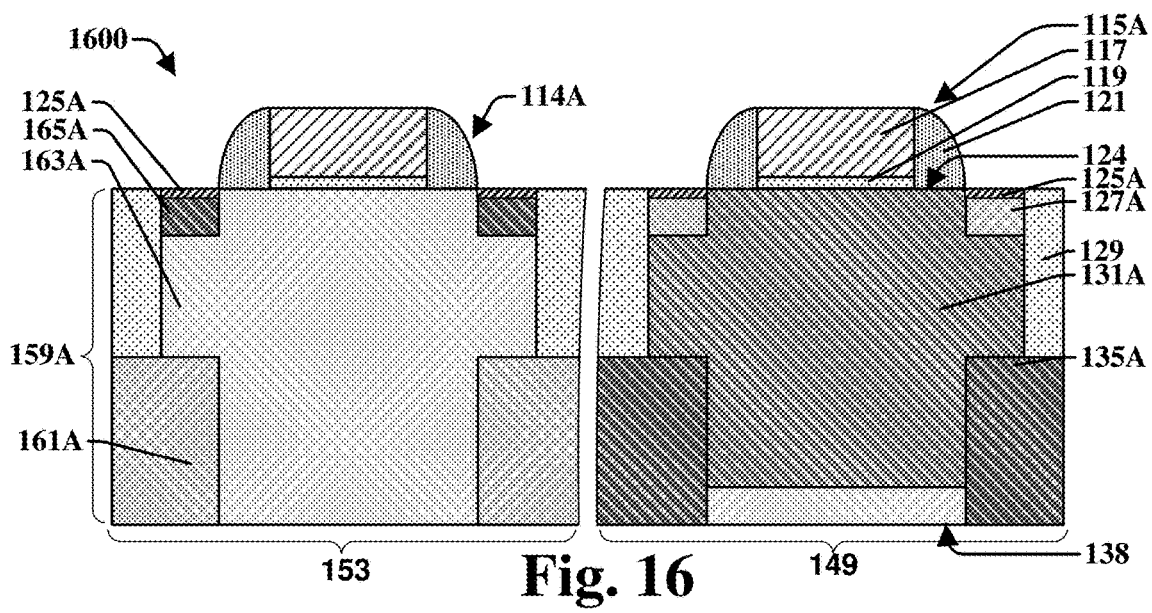

As shown by the cross-sectional view 1600 of FIG. 16, dummy gate electrodes 1203 may be replaced by metal gate electrodes 117 to form the gate structure 114A and the gate structure 115A. This illustrates a replacement gate process in which the gate replacement takes place after annealing the previous implants. By completing substrate doping and annealing prior to forming metal gate electrodes 117, undesirable interactions between metal gate electrodes 117 and high-k gate dielectric 119 may be avoided.

Figure 17:
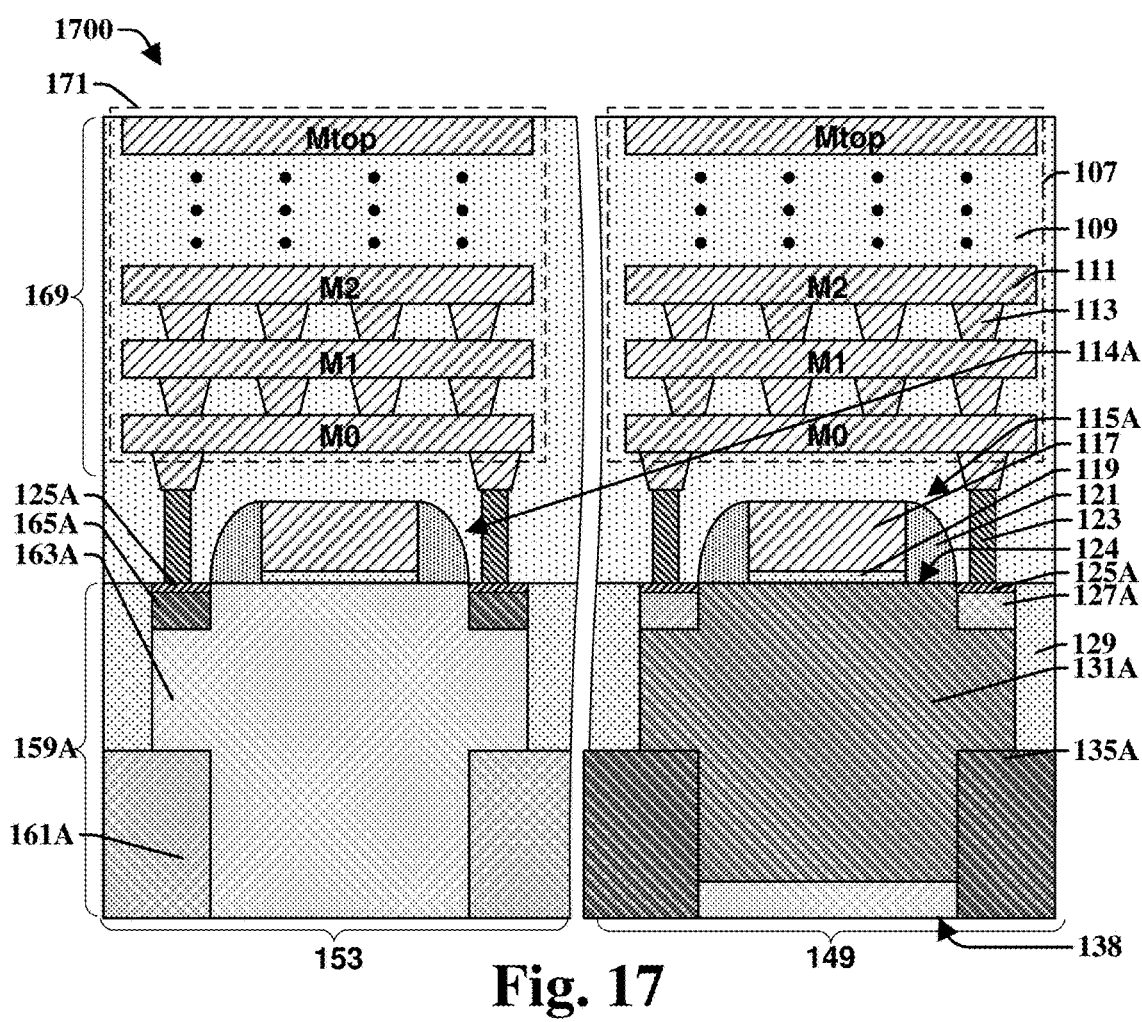

As shown by the cross-sectional view 1700 of FIG. 17, metal plugs 123 and the metal interconnect structure 169 may be formed on the front side 124. These structures may be formed by standard back-end-of-line (BEOL) processes, which may include damascene or dual damascene processes.

Figure 18:
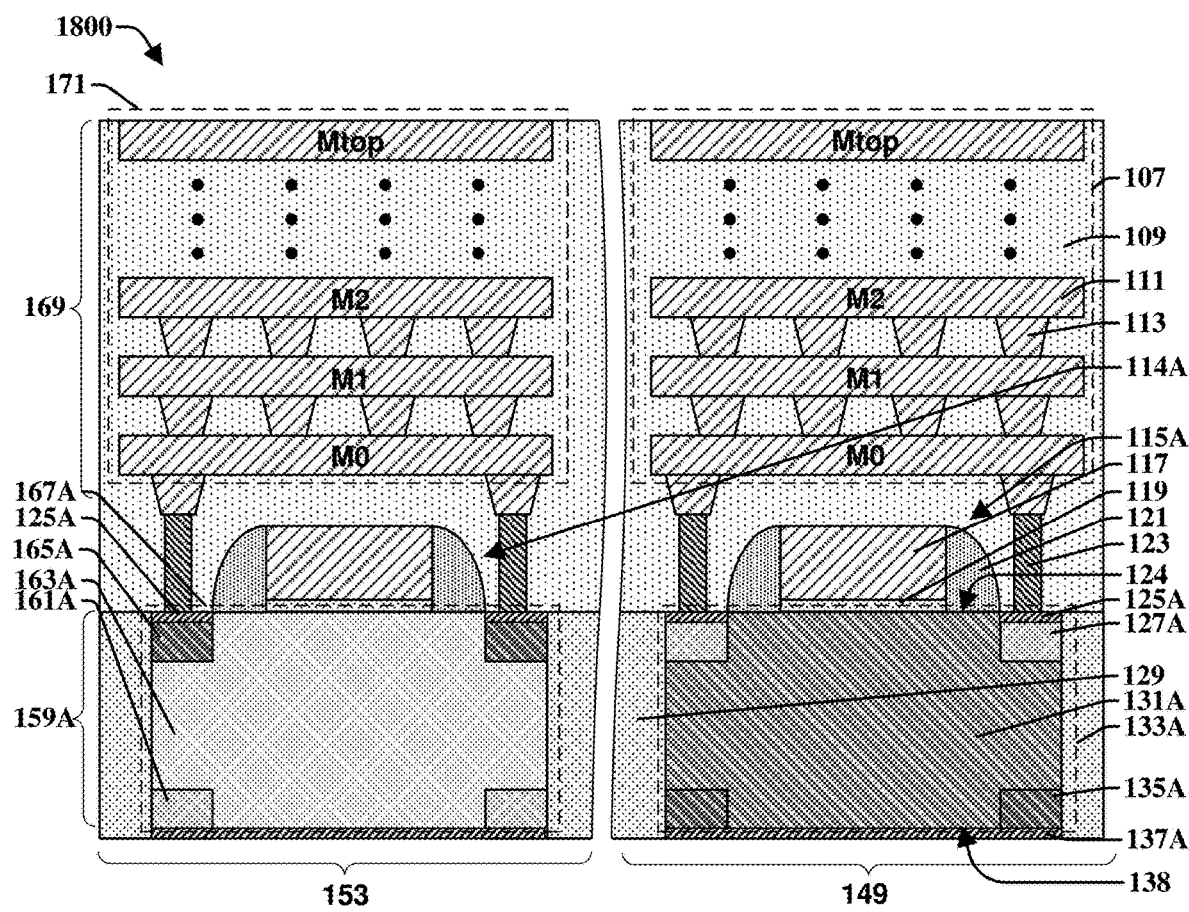

As shown by the cross-sectional view 1800 of FIG. 18, the semiconductor body 159A may be thinned by removing material from the back side 138. The thinning may be accomplished by any suitable process or processes. The processes may include one or more of wet etching, dry etching, and chemical mechanical polishing. A wafer including the semiconductor body 159A may be flipped for this processing. The surface being thinned maybe levelled at times with a spin-on coating or the like. Thinning produces the pull-down diode 167A and the pull-up diode 133A with heavily P-doped regions 161A and heavily N-doped regions 135A on back side 138. Silicide pads 156A and 137A may then be formed by reaction with the semiconductor body 159A on back side 138.

Figure 19:
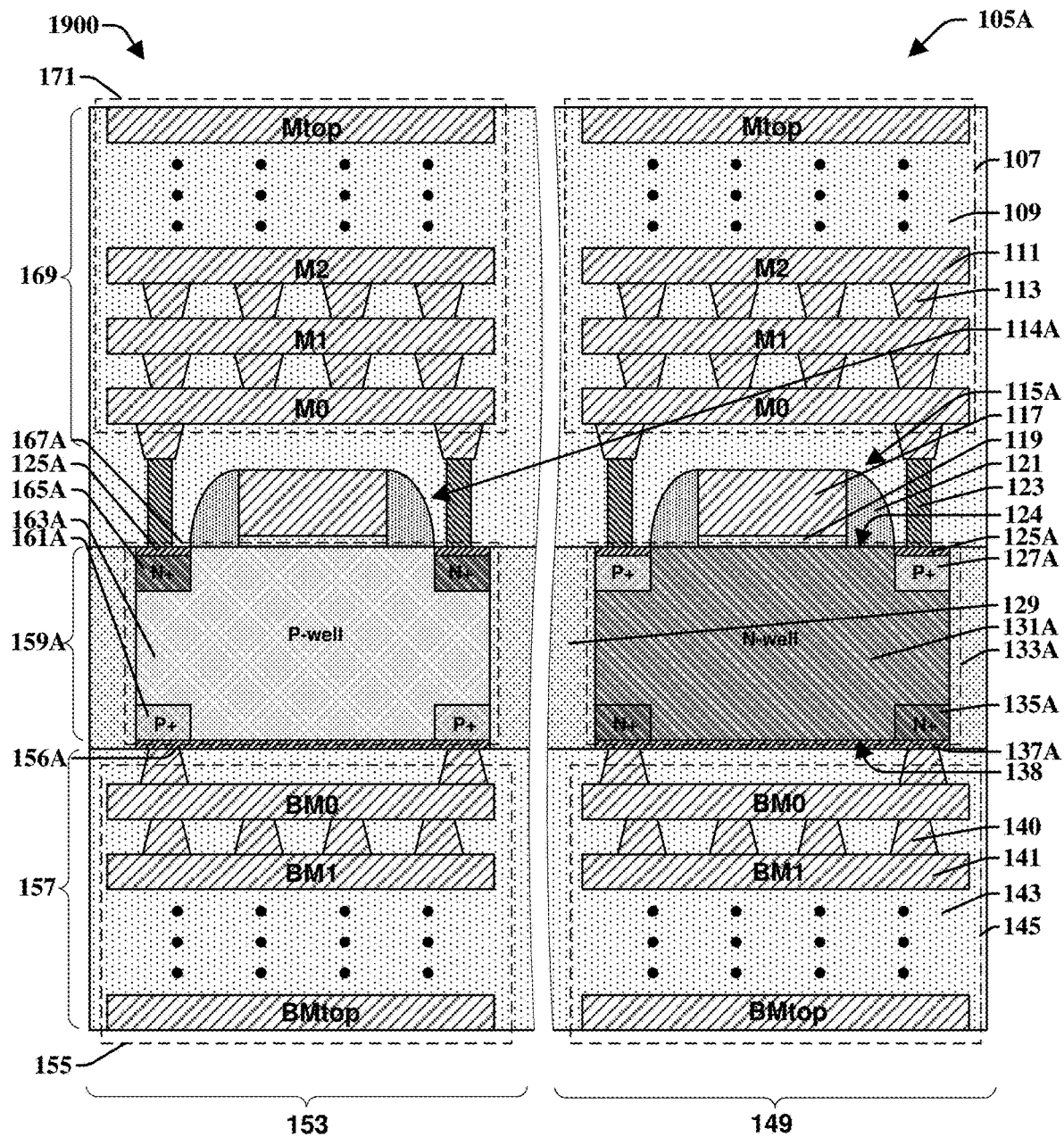

As shown by the cross-sectional view 1900 of FIG. 19, bottom metal interconnect structure 157 may then be formed on back side 138. The bottom metal interconnect structure 157 may be formed by processes like those used to form the metal interconnect structure 169. Passivation layers, contact pads, solder balls, or the like may then be formed to provide a completed device such as the one illustrated by the cross-sectional view 100 of FIG. 1.

Figure 20:
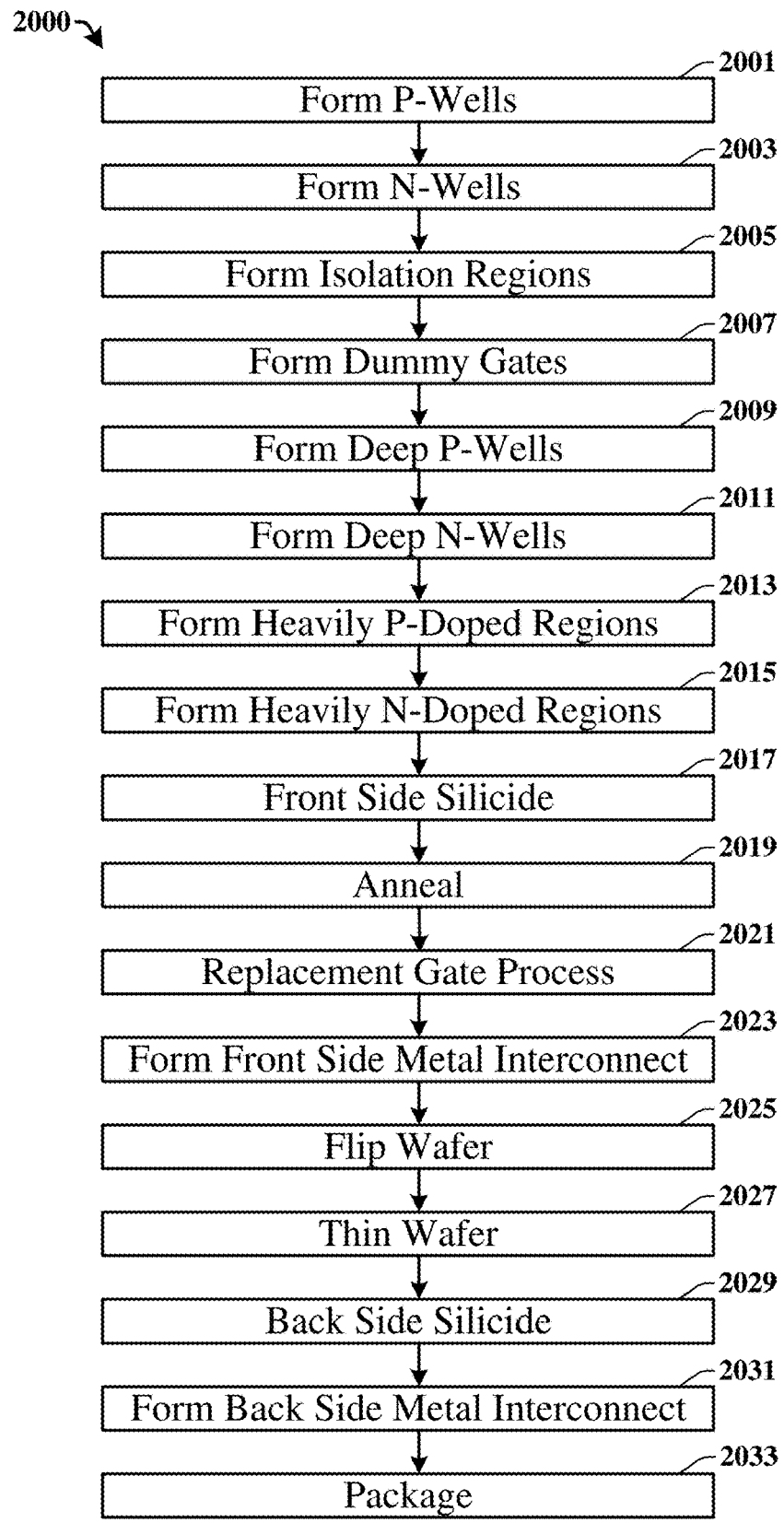
FIG. 20 provides a flow diagram for an example method of forming an integrated circuit device in accordance with some aspects of the present teachings.

FIG. 20 provides a flow diagram of some embodiments of a method 2000 of forming an integrated circuit device with diodes according to the present disclosure. While the method 2000 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

The method 2000 may begin with act 2001, forming P-wells, and act 2003, forming the N-wells. FIG. 10 provides one example. The processes of forming the P-wells and forming the N-wells may include one or more of plasma implantation, diffusion, or epitaxial growth, and providing a semiconductor body with some initial doping type.

The method 2000 may continue with act 2005, forming isolation regions. These may be STI regions as shown in FIG. 12. Other types of isolation regions, such as field oxide, may be used instead. The STI regions may be formed before or after any of the doping operations of the method 2000.

The method 2000 may continue with act 2007, forming dummy gates structures as shown in FIG. 14. In some embodiments, these may by polysilicon gates, metal gates, or dummy gates. In some embodiments, the diodes are not gate-aligned and this step is optional.

The method 2000 may continue with act 2009, forming deep P-wells as shown in FIG. 13 and act 2011, forming deep N-wells as shown in FIG. 14. These deep wells may be heavily doped regions that facilitate back side contact. Heavily doped regions for back side contacts may be formed by other methods or eliminated altogether.

Act 2013 is forming N-doped diffusion regions and act 2015 is forming P-doped diffusion regions, and act 2017 is saliciding all of which are illustrated by FIG. 15. The diffusion region are heavily doped regions adjacent an upper surface and may be gate aligned. The salicide process may be a silicide process self-aligned to gate structures.

Act 2019 is high temperature annealing of the various dopant implants. Act 2021 is a replacement gate process as shown in FIG. 16. Act 2023 is forming a metal interconnect on the front side as shown in FIG. 17.

Act 2025 is flipping the wafer. Flipping the wafer marks a transition from processing applied to front side 124 to processing applied to back side 138. The wafer may not need to be flipped, but typical wafer processing equipment is designed to operate on an upward facing side of the wafer for which reason a physical process of turning the wafer over may be used.

Act 2027 is thinning the wafer as shown in FIG. 18. Act 2029 is forming silicide on the back side as also shown by FIG. 18. Act 2031 is forming a metal interconnect on the back side as shown in FIG. 19. Act 2033 is further processing to complete the formation of an integrated circuit device.

Some aspects of the present teachings relate to an integrated circuit device that includes a semiconductor body having a front side and a back side. A front metal structure is formed on the front side and a back metal structure is formed on the back side. Within the semiconductor body is a PN diode having a PN junction, a P-doped contact, and an N-doped contact. The PN junction is formed by an interface between a P-doped region of the semiconductor body and an N-doped region of the semiconductor body. One of the P-doped contact and the N-doped contact is a front contact being on the front side and the other is a back contact being on the back side. The front contact is coupled to the front metal structure. The back contact is coupled to the back metal structure.

Some aspects of the present teachings relate to an integrated circuit device including
a first metal interconnect and a second metal interconnect on opposite sides of a semiconductor substrate, a VSS rail and a VDD rail configured to power a circuit, an I/O terminal for the circuit, and an ESD protection device for the circuit. The ESD protection device includes a first PN diode and a second PN diode formed in the semiconductor substrate. The first PN diode is coupled to the I/O terminal through a first I/O terminal coupling and is coupled to the VDD rail through a VDD rail coupling. The second PN diode is coupled to the I/O terminal through a second I/O terminal coupling and is coupled to the VSS rail through a VSS rail coupling. The first metal interconnect and the second metal interconnect each provide just one of the first I/O terminal coupling and the VDD rail coupling and just one of the second I/O terminal coupling and the VSS rail coupling.

Some aspects of the present teachings relate to a method of providing an ESD protection device for an integrated circuit. The method includes forming a PN diode in a semiconductor substrate having a front side and a back side, forming a first metal interconnect on the front side, and forming a second metal interconnect on a back side. The first metal interconnect is coupled with a first contact of the PN diode on the front side. The second metal interconnect is coupled with a second contact of the PN diode on the back side.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit device, comprising:
    a semiconductor body having a front side, a back side, a first P-doped region, a first N-doped region, a second P-doped region, and a second N-doped region;
    a protected circuit; and
    an ESD protection device comprising
        a first PN diode comprising a first PN junction, a first front side P-terminal, and a back side N-terminal, wherein the first PN junction is formed by the first P-doped region and the first N-doped region, the first front side P-terminal is provided by a heavily P-doped portion of the first P-doped region that is by the front side, and the back side N-terminal is provided by a heavily N-doped portion of the first N-doped region that is by the back side;
        a second PN diode comprising a second PN junction, a front side N-terminal, and a back side P-terminal, wherein the second PN junction is formed by the second P-doped region and the second N-doped region, the front side N-terminal is provided by a heavily N-doped portion of the second N-doped region that is by the front side, and the back side P-terminal is provided by a heavily P-doped portion of the second P-doped region that is by the back side;
        a first metal contact plug directly over and coupling with the first front side P-terminal; and
        a second metal contact plug directly over and coupling with the front side N-terminal;
    wherein the ESD protection device provides ESD protection for the protected circuit; and
    the first PN diode comprises a second front side P-terminal, wherein the first front side P-terminal and the second front side P-terminal are on opposite sides of a gate structure that is on the front side, and the first front side P-terminal and the second front side P-terminal are both connected to a wire in a metal interconnect structure on the front side.

2. The integrated circuit device of claim 1, wherein the ESD protection device is without Zener or Schottky diodes.

3. The integrated circuit device of claim 1, further comprising a first metal interconnect coupled to the first metal contact plug, wherein the first metal interconnect includes one or more first wires in a first metallization layer, one or more second wires in a second metallization layer that is above the first metallization layer, and a plurality of first vias coupling the one or more first wires to the one or more second wires.

4. The integrated circuit device of claim 3, further comprising a second metal interconnect on the back side coupled to the back side N-terminal , wherein the second metal interconnect includes one or more third wires in a third metallization layer, one or more fourth wires in a fourth metallization layer that is below the third metallization layer, and a plurality of second vias coupling the one or more third wires to the one or more fourth wires.

5. The integrated circuit device of claim 1, further comprising a silicide layer in direct contact with the back side N-terminal.

6. The integrated circuit device of claim 1, further comprising a silicide pad on the front side, wherein the silicide pad is between the first front side P-terminal and the first metal contact plug.

7. The integrated circuit device of claim 6, wherein the first front side P-terminal separates the silicide pad from the first P-doped region of the semiconductor body.

8. The integrated circuit device of claim 1, wherein the first PN diode is a P+/N-well junction diode and the second PN diode is the first PN diode is a N+/P-well junction diode.

9. The integrated circuit device of claim 1, wherein the ESD protection device and the protected circuit are on one chip.

10. The integrated circuit device of claim 1, wherein the ESD protection device is operative without Zener or Schottky diodes.

11. The integrated circuit device of claim 1, wherein the first N-doped region has a lower dopant concentration than the back side N-terminal.

12. An integrated circuit device, comprising:
    a semiconductor body, wherein the semiconductor body has a first side and a second side on opposite faces of the semiconductor body;
    a first metal interconnect structure on the first side, wherein the first metal interconnect structure comprises a first plurality of metallization layers in a first stack;
    a second metal interconnect structure on the second side, wherein the second metal interconnect structure comprises a second plurality of metallization layers in a second stack;
    a $V_{SS}$ rail and a $V_{DD}$ rail in the first metal interconnect structure, wherein the $V_{SS}$ rail and the $V_{DD}$ rail are configured to power a circuit;
    an I/O terminal for the circuit, wherein the I/O terminal is connected to an I/O wire in the second metal interconnect structure; and
    an ESD protection device for the circuit comprising a pull up diode and a pull down diode, wherein the pull up diode and the pull down diode are in the semiconductor body, the pull up diode is connected to the $V_{DD}$ rail through a first plurality of contact plugs on the first side and a first plurality of vias connecting between each adjacent pair of the first plurality of metallization layers, and the pull down diode is connected to the $V_{SS}$ rail through a second plurality of contact plugs on the first side and a second plurality of vias connecting between each adjacent pair of the first plurality of metallization layers;

wherein two of the first plurality of contact plugs are on opposite sides of a first gate structure; and two of the second plurality of contact plugs are on opposite sides of a second gate structure.

13. The integrated circuit device of claim 12, wherein the ESD protection device and the circuit are on one chip.

14. The integrated circuit device of claim 12, wherein the ESD protection device is without Zener or Schottky diodes.

15. The integrated circuit device of claim 12, wherein the pull down diode is connected to the I/O wire through a fourth plurality of contact plugs on the second side and a fourth plurality of vias connecting between each adjacent pair of the second plurality of metallization layers.

16. The integrated circuit device of claim 12, wherein each of the second plurality of metallization layers includes a plurality of wires connected in parallel with the I/O wire.

17. The integrated circuit device of claim 12, wherein the first plurality of vias forms connections with parallel wires in each of the first plurality of metallization layers.

18. The integrated circuit device of claim 12, wherein the pull down diode is a P+/N-well junction diode and the pull up diode is a N+/P-well junction diode.

19. An integrated circuit device, comprising:

a semiconductor body, wherein the semiconductor body has a first side and a second side on opposite faces of the semiconductor body;

a first metal interconnect structure on the first side, wherein the first metal interconnect structure comprises a first plurality of metallization layers in a first stack;

a second metal interconnect structure on the second side, wherein the second metal interconnect structure comprises a second plurality of metallization layers in a second stack;

a $V_{SS}$ rail and a $V_{DD}$ rail in the first metal interconnect structure, wherein the $V_{SS}$ rail and the $V_{DD}$ rail are configured to power a circuit;

an I/O terminal for the circuit, wherein the I/O terminal is connected to an I/O wire in the second metal interconnect structure; and an ESD protection device for the circuit comprising a pull up diode and a pull down diode, wherein the pull up diode and the pull down diode are in the semiconductor body, the pull up diode is connected to the $V_{DD}$ rail through a first plurality of contact plugs on the first side and a first plurality of vias connecting between each adjacent pair of the first plurality of metallization layers, and the pull down diode is connected to the $V_{SS}$ rail through a second plurality of contact plugs on the first side and a second plurality of vias connecting between each adjacent pair of the first plurality of metallization layers;

wherein two of the first plurality of contact plugs are on opposite sides of a first shallow trench isolation structure formed in the first side; and two of the second plurality of contact plugs are on opposite sides of a second shallow trench isolation structure formed in the first side.

20. The integrated circuit device of claim 19, wherein the pull up diode is connected to the I/O terminal through a third plurality of contact plugs on the second side and a third plurality of vias connecting between each adjacent pair of the second plurality of metallization layers.

* * * * *